United States Patent
Broyde et al.

(10) Patent No.: US 9,991,911 B1
(45) Date of Patent: Jun. 5, 2018

(54) METHOD FOR AUTOMATICALLY ADJUSTING A TUNABLE PASSIVE ANTENNA AND A TUNING UNIT, AND APPARATUS FOR RADIO COMMUNICATION USING THIS METHOD

(71) Applicant: TEKCEM, Maule (FR)

(72) Inventors: Frédéric Broyde, Maule (FR); Evelyne Clavelier, Maule (FR)

(73) Assignee: Tekcem (FR)

( * ) Notice: Subject to any disclaimer, the term of this patent is extended or adjusted under 35 U.S.C. 154(b) by 0 days. days.

(21) Appl. No.: 15/814,689

(22) Filed: Nov. 16, 2017

Related U.S. Application Data

(63) Continuation of application No. PCT/IB2017/056501, filed on Oct. 19, 2017.

(51) Int. Cl.
*H04B 1/04* (2006.01)
*H01Q 9/04* (2006.01)
*H01Q 21/00* (2006.01)
*H03H 7/40* (2006.01)

(52) U.S. Cl.
CPC ......... *H04B 1/0458* (2013.01); *H01Q 9/0442* (2013.01); *H01Q 21/005* (2013.01); *H03H 7/40* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,234,960 A | * | 11/1980 | Spilsbury | H03H 7/40 334/20 |
| 4,356,458 A | | 10/1982 | Armitage | |
| 5,225,847 A | * | 7/1993 | Roberts | H01Q 7/005 333/17.3 |

(Continued)

FOREIGN PATENT DOCUMENTS

| | | |
|---|---|---|
| FR | 3018973 A1 | 9/2015 |
| WO | WO2015/140660 A1 | 9/2015 |

OTHER PUBLICATIONS

Ariyur et al., "Real-Time Optimization by Extremum-Seeking Control", Wiley-Interscience, 2003.

(Continued)

*Primary Examiner* — Nay A Maung
*Assistant Examiner* — Erica Fleming-Hall
(74) *Attorney, Agent, or Firm* — Barnes & Thornburg LLP

(57) ABSTRACT

The invention relates to a method for automatically adjusting one or more tunable passive antennas and a single-input-port and single-output-port tuning unit. The invention also relates to an apparatus for radio communication using this method, for instance a radio transceiver. An apparatus for radio communication of the invention comprises: a tunable passive antenna; a feeder; a single-input-port and single-output-port tuning unit; a sensing unit; a transmission and signal processing unit which applies an excitation to the input port, which delivers one or more antenna adjustment instructions, and which delivers one or more tuning unit adjustment instructions; and a control unit which delivers one or more antenna control signals to the tunable passive antenna, and one or more tuning control signals to the single-input-port and single-output-port tuning unit.

20 Claims, 16 Drawing Sheets

(56) References Cited

U.S. PATENT DOCUMENTS

| | | | |
|---|---|---|---|
| 7,463,870 B2 | 12/2008 | Peusens et al. | |
| 7,535,312 B2 | 5/2009 | McKinzie, III | |
| 7,714,676 B2 | 5/2010 | McKinzie, III | |
| 8,299,867 B2 | 10/2012 | McKinzie, III | |
| 9,628,135 B1 | 4/2017 | Broyde et al. | |
| 9,680,510 B2* | 6/2017 | Broyde | H04B 1/0064 |
| 2003/0174100 A1 | 9/2003 | Ogawa et al. | |
| 2010/0073103 A1 | 3/2010 | Spears et al. | |
| 2010/0182216 A1 | 7/2010 | Schmidhammer | |
| 2010/0248649 A1* | 9/2010 | White | H03J 3/20 455/77 |
| 2016/0043526 A1* | 2/2016 | Kutz | H01S 3/1115 700/90 |
| 2017/0176954 A1* | 6/2017 | Salsbury | G05B 13/022 |

OTHER PUBLICATIONS

Liu et al., "Stochastic Averaging and Stochastic Extremum Seeking", Springer-Verlag, 2012.

Calli et al., "Comparison of Extremum Seeking Control Algorithms for Robotic Applications", Proc. of the 2012 IEEE/RSJ International Conference on Intelligent Robots and Systems, pp. 3195-3202, Oct. 2012.

Olalla et al., "Analysis and Comparison of Extremum Seeking Control Techniques", Proc. 2007 IEEE International Symposium on Industrial Electronics, pp. 72-76, Jun. 2007.

Zhang et al., "Extremum-Seeking Control and Application", Springer-Verlag, 2012.

Brent, "Algorithms for minimization without derivatives", Prentice-Hall, 1973.

Press et al., "Numerical Recipes in Fortran 77—The art of Scientific Computing", Second Edition, Cambridge University Press, 1992.

Broyde et al., "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.

Broyde et al., "A Tuning Computation Technique for a Multiple-Antenna-Port and Multiple-User-Port Antenna Tuner", International Journal of Antennas and Propagation, 2016.

Duong et al., "A dynamically adaptable impedance-matching system for midrange wireless power transfer with misalignment", Energies, 2015.

"IEC Multilingual Dictionary of Electricity", Bureau Central de la Commission Electrotechnique Internationale, 1983.

Smith et al., "An improved Topology for Adaptive Agile Impedance Tuners", IEEE Antennas and Wireless Propagation Letters, vol. 12, pp. 92-95, 2013.

Ali et al., "Dynamic Real-Time Calibration for Antenna Matching in the Transmission Mode", 2010 IEEE Antenna and Propagation Society International Symposium (APS/URSI), Jul. 2010.

Petosa, "An Overview of Tuning Techniques for Frequency-Agile Antennas", IEEE Antennas and Propagation Magazine, vol. 54, No. 5, pp. 271-296, Oct. 2012.

* cited by examiner

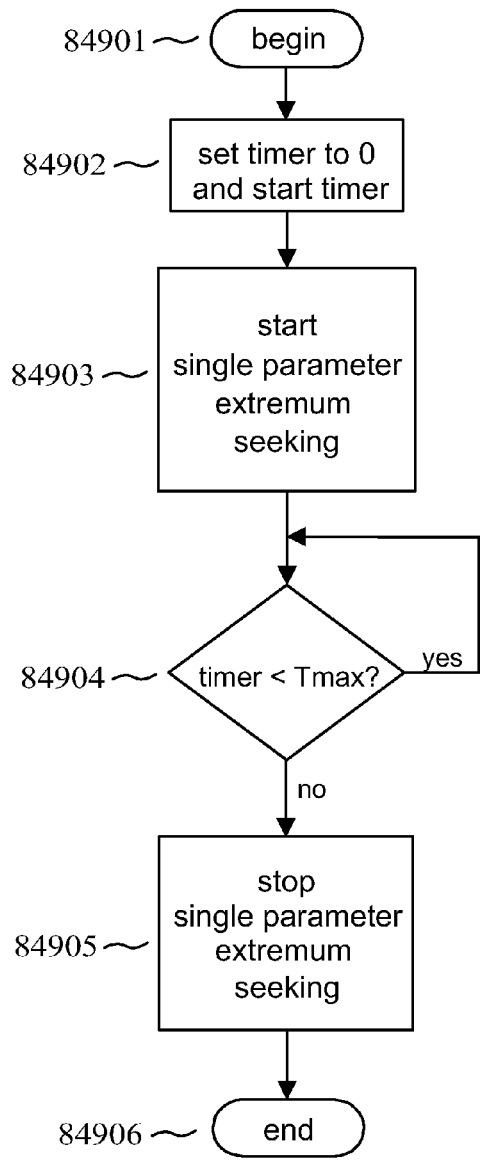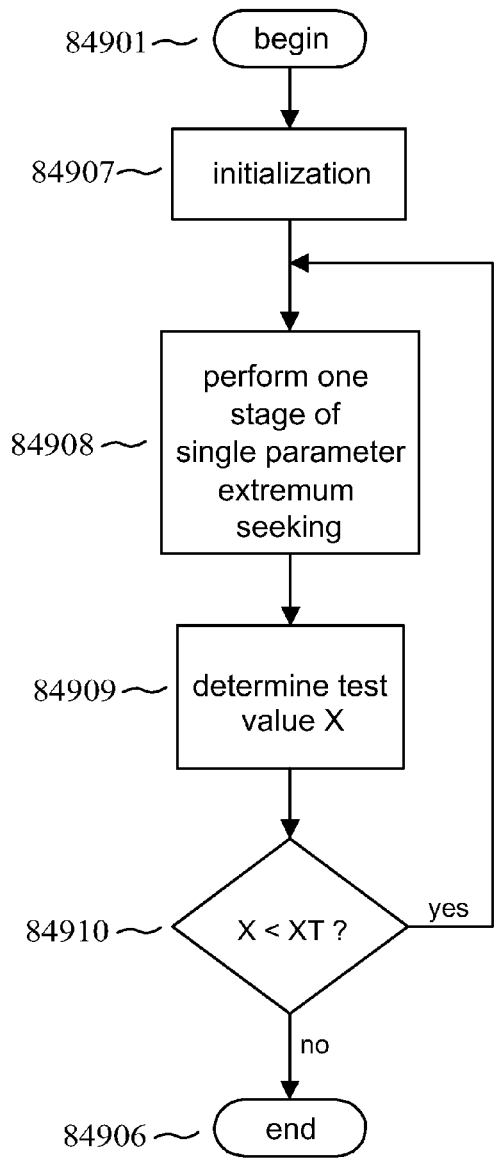
FIG. 20
FIG. 21

METHOD FOR AUTOMATICALLY ADJUSTING A TUNABLE PASSIVE ANTENNA AND A TUNING UNIT, AND APPARATUS FOR RADIO COMMUNICATION USING THIS METHOD

CROSS REFERENCE TO RELATED APPLICATIONS

This is a Continuation Application of PCT application No. PCT/IB2017/056501, filed 19 October 2017, entitled "Method for automatically adjusting a tunable passive antenna and a tuning unit, and apparatus for radio communication using this method", which in turn claims priority to French patent application No. FR1770537 of 25 May 2017, entitled "Procédé pour régler automatiquement une antenne passive accordable et une unité d'accord, et appareil pour communication radio utilisant ce procédé", both of which are incorporated herein by reference.

FIELD OF THE INVENTION

The invention relates to a method for automatically adjusting one or more tunable passive antennas and a single-input-port and single-output-port tuning unit, for instance a tunable passive antenna and a single-input-port and single-output-port tuning unit of a radio transmitter. The invention also relates to an apparatus for radio communication using this method, for instance a radio transceiver.

PRIOR ART

In what follows, in line with the "IEC multilingual dictionary of electricity" edited by the Bureau Central de la Commission Electrotechnique Internationale in 1983, "open-loop control" means control which does not utilize a measurement of the controlled variable, and "closed-loop control" (which is also referred to as "feedback control") means control in which the control action is made to depend on a measurement of the controlled variable.

A tunable passive antenna comprises at least one antenna control device having at least one parameter having an effect on one or more characteristics of said tunable passive antenna, said at least one parameter being adjustable, for instance by electrical means. Adjusting a tunable passive antenna means adjusting at least one said at least one parameter. Each of said one or more characteristics may for instance be an electrical characteristic such as an impedance at a specified frequency, or an electromagnetic characteristic such as a directivity pattern at a specified frequency. A tunable passive antenna may also be referred to as "reconfigurable antenna". Some authors consider three classes of tunable passive antennas: polarization-agile antennas, pattern-reconfigurable antennas and frequency-agile antennas. The state of the art regarding frequency-agile antennas is for instance described in the article of A. Petosa entitled "An Overview of Tuning Techniques for Frequency-Agile Antennas", published in *IEEE Antennas and Propagation Magazine*, vol. 54, No. 5, in October 2012. As explained in this article, many different types of antenna control device may be used to control one or more characteristics of a tunable passive antenna. An antenna control device may for instance be:

an electrically controlled switch or change-over switch, in which case a parameter of the antenna control device having an effect on one or more characteristics of the tunable passive antenna may be the state of the switch or change-over switch;

an adjustable impedance device, in which case a parameter of the antenna control device having an effect on one or more characteristics of the tunable passive antenna may be the reactance or the impedance of the adjustable impedance device at a specified frequency; or an actuator arranged to produce a mechanical deformation of the tunable passive antenna, in which case a parameter of the antenna control device having an effect on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes or one or more insulated-gate field-effect transistors (MOSFETs) as switching devices.

An adjustable impedance device is a component comprising two terminals which substantially behave as the terminals of a passive linear two-terminal circuit element, and which are consequently characterized by an impedance which may depend on frequency, this impedance being adjustable.

An adjustable impedance device having a reactance which is adjustable by electrical means may be such that it only provides, at a given frequency, a finite set of reactance values, this characteristic being for instance obtained if the adjustable impedance device is:

a network comprising a plurality of capacitors or open-circuited stubs and one or more electrically controlled switches or change-over switches, such as electro-mechanical relays, or microelectromechanical switches, or PIN diodes or insulated-gate field-effect transistors, used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at a given frequency, a continuous set of reactance values, this characteristic being for instance achievable if the adjustable impedance device is based on the use of a variable capacitance diode; or a MOS varactor; or a microelectromechanical varactor (MEMS varactor); or a ferroelectric varactor.

Many methods exist for automatically adjusting one or more tunable passive antennas. Some of these methods are applicable to a radio transmitter, for instance the method disclosed in the U.S. Pat. No. 5,225,847 entitled "Automatic antenna tuning system". Some of these methods are applicable to a radio receiver, for instance the method disclosed in the U.S. Pat. No. 7,463,870 entitled "Receiver circuit and control method".

A first example of a method for automatically adjusting a tunable passive antenna, applicable to a radio transmitter, is implemented in the automatic antenna system shown in FIG. 1. This automatic antenna system is similar to the one disclosed in said U.S. Pat. No. 5,225,847. The automatic antenna system shown in FIG. 1 has a user port (31), the user port presenting, at a given frequency, an impedance referred to as "the impedance presented by the user port", the automatic antenna system comprising:

- a tunable passive antenna (1), the tunable passive antenna comprising at least one antenna control device, one or more characteristics of the tunable passive antenna being controlled by utilizing said at least one antenna control device, said at least one antenna control device having at least one parameter having an effect on said one or more characteristics, said at least one parameter being adjustable by electrical means;
- a sensing unit (3) delivering two "sensing unit output signals", each of the sensing unit output signals being determined by one electrical variable sensed (or measured) at the user port;
- a feeder (2) having a first end coupled to a signal port of the tunable passive antenna, the feeder having a second end coupled to the user port, through the sensing unit;
- a signal processing unit (5), the signal processing unit estimating q real quantities depending on the impedance presented by the user port, where q is an integer greater than or equal to 1, using the sensing unit output signals caused by an excitation applied to the user port, the signal processing unit delivering an "adjustment instruction" as a function of said q real quantities depending on the impedance presented by the user port; and
- a control unit (6), the control unit receiving the adjustment instruction from the signal processing unit (5), the control unit delivering "control signals", the control signals being determined as a function of the adjustment instruction, each of said parameters being mainly determined by at least one of the control signals.

Unfortunately, it was found that a tunable passive antenna often only provides a poor tuning capability, so that it is often not possible to obtain that the automatic antenna system shown in FIG. 1 can sufficiently reduce or cancel any variation in the impedance presented by the user port, caused by a variation in a frequency of operation, and/or caused by the well-known user interaction.

This problem is solved in a second example of a method for automatically adjusting a tunable passive antenna, applicable to a radio transmitter, which is implemented in the automatic antenna system shown in FIG. 2. This automatic antenna system is similar to the one disclosed in the ninth embodiment of the French patent application No. 14/00666 of 20 Mar. 2014 and of the PCT application No. PCT/IB2015/051644 of 6 Mar. 2015 (WO 2015/140660). The automatic antenna system shown in FIG. 2 has a user port (31), the user port presenting, at a given frequency, an impedance referred to as "the impedance presented by the user port", the automatic antenna system comprising:

- a tunable passive antenna (1), the tunable passive antenna comprising at least one antenna control device, one or more characteristics of the tunable passive antenna being controlled by utilizing said at least one antenna control device, said at least one antenna control device having at least one parameter having an effect on said one or more characteristics, said at least one parameter being adjustable by electrical means;
- a sensing unit (3) delivering two "sensing unit output signals", each of the sensing unit output signals being determined by one electrical variable sensed (or measured) at the user port;
- a single-input-port and single-output-port tuning unit (4) having an input port and an output port, the input port being coupled to the user port through the sensing unit, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at said given frequency, each of the one or more adjustable impedance devices of the tuning unit has a reactance, the reactance of any one of the one or more adjustable impedance devices of the tuning unit being adjustable by electrical means;
- a feeder (2) having a first end coupled to a signal port of the tunable passive antenna, the feeder having a second end coupled to the output port;
- a signal processing unit (5), the signal processing unit estimating q real quantities depending on the impedance presented by the user port, where q is an integer greater than or equal to 1, using the sensing unit output signals caused by an excitation applied to the user port, the signal processing unit delivering an "adjustment instruction" as a function of said q real quantities depending on the impedance presented by the user port; and
- a control unit (6), the control unit receiving the adjustment instruction from the signal processing unit (5), the control unit delivering "control signals", the control signals being determined as a function of the adjustment instruction, the reactance of each of the one or more adjustable impedance devices of the tuning unit being mainly determined by at least one of the control signals, each of said parameters being mainly determined by at least one of the control signals.

This second example of a method for automatically adjusting a tunable passive antenna may provide an excellent tuning capability. Unfortunately, it can be shown that an adjustment of the single-input-port and single-output-port tuning unit obtained using this second example of a method for automatically adjusting a tunable passive antenna is typically not close to an optimal adjustment, when the losses in the single-input-port and single-output-port tuning unit are not very small.

Consequently, there is no known solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small.

SUMMARY OF THE INVENTION

The purpose of the invention is a method for automatically adjusting one or more tunable passive antennas and a single-input-port and single-output-port tuning unit, without the above-mentioned limitations of known techniques, and also an apparatus for radio communication using this method.

In what follows, X and Y being different quantities or variables, performing an action as a function of X does not preclude the possibility of performing this action as a function of Y. In what follows, "having an influence" and "having an effect" have the same meaning. In what follows, "coupled", when applied to two ports (in the meaning of circuit theory), may indicate that the ports are directly coupled, in which case each terminal of one of the ports is connected to (or, equivalently, in electrical contact with) one and only one of the terminals of the other port, and/or that the ports are indirectly coupled, in which case an electrical interaction different from direct coupling exists between the ports, for instance through one or more components.

The method of the invention is a method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:
  delivering one or more "antenna control signals", each of the one or more tunable passive antennas comprising at least one antenna control device, one or more characteristics of said each of the one or more tunable passive antennas being controlled by utilizing said at least one antenna control device, said at least one antenna control device having at least one parameter having an influence on said one or more characteristics, said at least one parameter being adjustable by electrical means, said at least one parameter being mainly determined by at least one of the one or more antenna control signals;
  applying an excitation to the input port;
  sensing one or more electrical variables at the output port while the excitation is applied, to obtain one or more "sensing unit output signals", each of the one or more sensing unit output signals being mainly determined by at least one of the one or more electrical variables sensed at the output port;
  estimating q real quantities depending on an impedance seen by the output port, where q is an integer greater than or equal to one, by utilizing one or more of the one or more sensing unit output signals; and
  delivering one or more "tuning control signals", the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals, the step of delivering one or more tuning control signals comprising the following steps:
    generating, for each of the one or more tuning control signals, an initial value of said each of the one or more tuning control signals, as a function of one or more of the q real quantities depending on an impedance seen by the output port; and
    generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

The given frequency may for instance be a frequency greater than or equal to 150 kHz. The specialist understands that the impedance seen by the output port is a complex number, and that an impedance presented by the input port is a complex number. We will use $Z_{Sant}$ to denote the impedance seen by the output port, and $Z_U$ to denote the impedance presented by the input port.

Each of the one or more tunable passive antennas has a port, referred to as the "signal port" of the tunable passive antenna, which can be used to receive and/or to emit electromagnetic waves. Each of the one or more tunable passive antennas comprises at least one antenna control device, which may comprise one or more terminals used for other electrical connections. It is assumed that each of the one or more tunable passive antennas behaves, at the given frequency, with respect to its signal port, substantially as a passive antenna, that is to say as an antenna which is linear and does not use an amplifier for amplifying signals received by the antenna or signals emitted by the antenna. Let N be the number of the one or more tunable passive antennas. As a consequence of linearity, and considering only, for each of the one or more tunable passive antennas, its signal port, it is possible to define: if N is equal to one, an impedance presented by the one or more tunable passive antennas; and if N is greater than or equal to two, an impedance matrix presented by the one or more tunable passive antennas, this impedance matrix being of size N×N.

As said above in the prior art section, each of said one or more characteristics may for instance be an electrical characteristic such as an impedance at a specified frequency, or an electromagnetic characteristic such as a directivity pattern at a specified frequency.

It is said above that the apparatus for radio communication allows, at the given frequency, a transfer of power from the input port to an electromagnetic field radiated by the one or more tunable passive antennas. In other words, the apparatus for radio communication is such that, if a power is received by the input port at the given frequency, a part of said power received by the input port is transferred to an electromagnetic field radiated by the one or more tunable passive antennas at the given frequency, so that a power of the electromagnetic field radiated by the one or more tunable passive antennas at the given frequency is equal to said part of said power received by the input port. For instance, the specialist knows that a power of the electromagnetic field radiated by the one or more tunable passive antennas (average radiated power) can be computed as the flux of the real part of a complex Poynting vector of the electromagnetic field radiated by the one or more tunable passive antennas, through a closed surface containing the one or more tunable passive antennas.

To obtain that the apparatus for radio communication allows, at the given frequency, a transfer of power from the input port to an electromagnetic field radiated by the one or more tunable passive antennas, at least one of the one or more tunable passive antennas may for instance be coupled, directly or indirectly, to the output port. More precisely, for at least one of the one or more tunable passive antennas, the signal port of the tunable passive antenna may for instance be coupled, directly or indirectly, to the output port. For instance, an indirect coupling may be a coupling through a feeder and/or through a sensing unit and/or through a power combiner or a power divider. For suitable values of the one or more tuning control signals and of the one or more antenna control signals, said transfer of power from the input port to an electromagnetic field radiated by the one or more tunable passive antennas may for instance be a transfer of power with small or negligible or zero losses, this characteristic being preferred.

According to the invention, each of said q real quantities depending on an impedance seen by the output port may for instance be a real quantity representative of the impedance seen by the output port.

According to the invention, each of said q real quantities depending on an impedance seen by the output port may for instance be substantially proportional to the absolute value, or the phase, or the real part, or the imaginary part of the impedance seen by the output port, or of the inverse of the impedance seen by the output port (that is, the admittance seen by the output port), or of a voltage reflection coefficient at the output port, defined as being equal to $(Z_{Sant}-Z_O)(Z_{Sant}+Z_O)^{-1}$, where $Z_O$ is a reference impedance.

Extremum-seeking control algorithms are well known to specialists. Extremum-seeking control is a family of nonlinear control methods whose purpose is to autonomously find a maximum or a minimum of a performance variable, the performance variable being a real function of one or more outputs of a controlled system, by controlling one or more inputs of the controlled system. In an extremum-seeking control algorithm, one or more signals varying over time are caused to appear at these one or more inputs of the controlled system, in a way that allows the algorithm to probe the nonlinearity of the performance variable with respect to the one or more inputs of the controlled system, and to get closer to an extremum. Thus, extremum-seeking control algorithms are based on the information that the extremum exists, but they do not need an exact knowledge of the controlled system to find the extremum. For this reason, extremum seeking control is said to be a non-model-based real-time optimization approach. For instance, the book of K. B. Ariyur and M. Krstic, entitled "Real-Time Optimization by Extremum-Seeking Control" and published by Wiley-Interscience in 2003, describes a type of extremum-seeking control which uses one or more periodical perturbations (for instance sinusoidal perturbations), and which is usually referred to as perturbation based extremum-seeking control. For instance, the book of S.-J. Liu and M. Krstic, entitled "Stochastic Averaging and Stochastic Extremum Seeking" and published by Springer-Verlag in 2012, describes a type of extremum-seeking control which uses one or more stochastic perturbations (for instance random perturbations), and which is usually referred to as stochastic extremum-seeking control. There are many other types of extremum-seeking control, such as sliding mode extremum-seeking control, neural network extremum-seeking control, relay extremum seeking control, perturb and observe, numerical optimization based extremum-seeking control, etc, which are well known to specialists. For instance, the article of B. Calli, W. Caarls, P. Jonker and M. Wisse, entitled "Comparison of Extremum Seeking Control Algorithms for Robotic Applications" and published in *Proc. of the* 2012 *IEEE/RSJ International Conference on Intelligent Robots and Systems*, at the pages 3195-3202, in October 2012, and the article of C. Olalla, M. I. Arteaga, R. Leyva and A. E. Aroudi, entitled "Analysis and Comparison of Extremum Seeking Control Techniques" and published in *Proc. of the* 2007 *IEEE International Symposium on Industrial Electronics*, at the pages 72-76, in June 2007, present interesting comparisons of some types of extremum seeking control.

Since, according to the invention, the extremum-seeking control algorithm seeks to maximize or to minimize a performance variable by controlling said one or more of the one or more tuning control signals, the specialist understands that, in the context of the present invention, it is possible to consider that said one or more inputs of the controlled system are said one or more of the one or more tuning control signals. Thus, the extremum-seeking control algorithm controls and varies said one or more of the one or more tuning control signals over time, to get closer to an extremum (i.e., a maximum or a minimum) of the performance variable.

According to the invention, the performance variable is estimated as a function of one or more of the one or more sensing unit output signals. Thus, the performance variable depends on at least one of the one or more electrical variables sensed at the output port. For instance, it is possible that the performance variable is a real quantity depending on an absolute value of a complex voltage across the output port, or a real quantity representative of the absolute value of the complex voltage across the output port. Said real quantity depending on an absolute value of a complex voltage across the output port may for instance be substantially proportional to the absolute value of a voltage across the output port, or to the square of the absolute value of a voltage across the output port. For instance, it is possible that the performance variable is a real quantity depending on an absolute value of a complex current flowing out of the output port, or a real quantity representative of the absolute value of the complex current flowing out of the output port. Said real quantity depending on an absolute value of a complex current flowing out of the output port may for instance be substantially proportional to the absolute value of a current flowing out of the output port, or to the square of the absolute value of a current flowing out of the output port. For instance, it is possible that the performance variable is a real quantity depending on an absolute value of a complex incident voltage (which may also be referred to as "forward voltage") at the output port, or a real quantity representative of the absolute value of the complex incident voltage at the output port. Said real quantity depending on an absolute value of a complex incident voltage at the output port may for instance be substantially proportional to the absolute value of an incident voltage at the output port, or to the square of the absolute value of an incident voltage at the output port. For instance, it is possible that the performance variable is a real quantity depending on an average power delivered by the output port, or a real quantity representative of the average power delivered by the output port. Other explanations on the performance variable are provided below, in the presentations of the second embodiment, of the third embodiment and of the twenty-fourth embodiment.

According to the invention, it is for instance possible that the extremum-seeking control algorithm ends when a termination criterion is met. In other words, it is for instance possible that the extremum-seeking control algorithm stops seeking to maximize or to minimize the performance variable when a termination criterion is met. For instance, the termination criterion may be that the extremum-seeking control algorithm has been operating for a specified time. For instance, in the case where the extremum-seeking control algorithm seeks to minimize the performance variable, the termination criterion may be that the performance variable does not decrease rapidly (so that it may be reasonable to infer that the performance variable is near a minimum). For instance, in the case where the extremum-seeking control algorithm seeks to maximize the performance variable, the termination criterion may be that the performance variable does not increase rapidly (so that it may be reasonable to infer that the performance variable is near a maximum). For instance, the termination criterion may be that a termination request has been received.

While the extremum-seeking control algorithm seeks to maximize or to minimize the performance variable, it is possible that this control algorithm varies said one or more of the one or more tuning control signals over time, so that it is possible that the impedance presented by the input port varies over time, and that the performance variable varies over time. This may be detrimental for the operation of the apparatus for radio communication, because such variations may cause an unwanted fading. Thus, a possible advantage of a possible end of the extremum-seeking control algorithm is that the extremum-seeking control algorithm no longer varies said one or more of the one or more tuning control signals over time.

Some prior art methods for automatically adjusting either a tunable passive antenna, or a single-input-port and single-output-port tuning unit, use an extremum-seeking control algorithm. For instance, the chapter 7 of the book of C. Zhang and R. Ordóñez, entitled "Extremum-Seeking Control and Application" and published by Springer-Verlag in 2012, explains how an extremum-seeking control algorithm can be used to automatically adjust a single-input-port and single-output-port tuning unit, the extremum-seeking control algorithm seeking to reduce or minimize a reflected power at the input port. Likewise, the apparatuses disclosed in the U.S. Pat. No. 4,356,458, entitled "Automatic Impedance Matching Apparatus" and in said U.S. Pat. No. 5,225,847 use an extremum-seeking control algorithm which seeks to minimize a real quantity depending on a reflection coefficient at the input port or on a standing wave ratio at the input port. These prior art methods for automatically adjusting a single-input-port and single-output-port tuning unit do not have the three following characteristics of the invention:
  the method of the invention is for automatically adjusting one or more tunable passive antennas and a single-input-port and single-output-port tuning unit;
  in the invention, the extremum-seeking control algorithm is used after, for each of the one or more tuning control signals, an initial value of said each of the one or more tuning control signals has been generated, as a function of one or more of said q real quantities depending on an impedance seen by the output port;
  in the invention, the extremum-seeking control algorithm seeks to maximize or to minimize a performance variable estimated as a function of one or more sensing unit output signals mainly determined by one or more electrical variables sensed at the output port.

As shown in the following embodiments, these characteristics are such that the invention can be used to optimally, quickly and automatically adjust the one or more tunable passive antennas and the single-input-port and single-output-port tuning unit, without very difficult computations, in spite of the presence of losses in the single-input-port and single-output-port tuning unit.

The specialist sees a fundamental difference between the prior art method implemented in the automatic antenna system shown in FIG. 2, on the one part, and the invention, on the other part. Said prior art method uses sensing unit output signals, each of the sensing unit output signals being determined by one electrical variable sensed at the user port. In contrast, the method of the invention uses one or more sensing unit output signals, each of the one or more sensing unit output signals being mainly determined by at least one of the one or more electrical variables sensed at the output port.

The specialist understands that the one or more antenna control signals have an effect on each of said parameters, so that they may have an influence on the impedance seen by the output port, and on the impedance presented by the input port. In the previous sentence, "each of said parameters" clearly means "each said at least one parameter of each said at least one antenna control device of each of the one or more tunable passive antennas".

For instance, it is possible that open-loop control is utilized to generate said initial value of said each of the one or more tuning control signals. Equivalently, it is for instance possible that an open-loop control scheme is utilized to generate said initial value of said each of the one or more tuning control signals. This possible characteristic will be explained below in the presentations of the second embodiment, of the fourth embodiment and of the sixth embodiment.

For instance, it is possible that open-loop control is utilized to deliver each of the one or more antenna control signals. Equivalently, it is for instance possible that an open-loop control scheme is utilized to deliver each of the one or more antenna control signals. This possible characteristic will be explained below in the presentations of the fourth embodiment, of the sixth embodiment and of the twelfth embodiment. However, as shown in the presentations of the fifth embodiment, it is possible that closed-loop control is utilized to deliver each of the one or more antenna control signals.

An apparatus implementing the method of the invention is an apparatus for radio communication comprising:
  one or more tunable passive antennas, each of the one or more tunable passive antennas comprising at least one antenna control device, one or more characteristics of said each of the one or more tunable passive antennas being controlled by utilizing said at least one antenna control device, said at least one antenna control device having at least one parameter having an influence on said one or more characteristics, said at least one parameter being adjustable by electrical means;
  a single-input-port and single-output-port tuning unit having an input port and an output port, the apparatus for radio communication allowing, at a given frequency, a transfer of power from the input port to an electromagnetic field radiated by the one or more tunable passive antennas, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means;
  a sensing unit delivering one or more "sensing unit output signals", each of the one or more sensing unit output signals being mainly determined by one or more electrical variables sensed at the output port while an excitation is applied to the input port;
  a transmission and signal processing unit, the transmission and signal processing unit delivering one or more "antenna adjustment instructions", the transmission and signal processing unit applying the excitation to the input port, the transmission and signal processing unit estimating q real quantities depending on an impedance seen by the output port, where q is an integer greater than or equal to one, by utilizing one or more of the one or more sensing unit output signals, the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of one or more of the q real quantities depending on an impedance seen by the output port, at least one of the tuning unit adjustment instructions being a "subsequent tuning unit adjustment instruction", the transmission and signal processing unit performing an extremum-seeking control algorithm to generate each of the one or more subsequent tuning unit adjustment instructions, the extremum-seeking control algorithm seeking to maximize or to minimize a performance variable, the performance variable being estimated as a function of one or more of the one or more sensing unit output signals; and a control unit, the control unit delivering one or more "antenna control signals" to the one or more tunable passive antennas, each of the one or more antenna control signals being determined as a function of at least one of the one or more antenna adjustment instructions, each of said parameters being mainly determined by at least one of the one or more antenna control signals, the control unit delivering one or more "tuning control signals" to the single-input-port and single-output-port tuning unit, the control unit generating, for each of the one or more tuning control signals, one or more values of said each of the one or more tuning control signals, said one or more values of said each of the one or more tuning control signals being determined as a function of at least one of the tuning unit adjustment instructions, the reactance of each of the one or more adjustable impedance devices of the tuning unit being mainly determined by at least one of the one or more tuning control signals.

In the previous sentence, "each of said parameters" clearly means "each said at least one parameter of each said at least one antenna control device of each of the one or more tunable passive antennas".

For instance, each of said electrical variables may be a voltage, or an incident voltage, or a reflected voltage, or a current, or an incident current, or a reflected current. For instance, the control unit may be such that:

for each of the one or more tuning control signals, said one or more values of said each of the one or more tuning control signals comprise an initial value determined as a function of one of the one or more initial tuning unit adjustment instructions; and for one or more of the one or more tuning control signals, said one or more values of each said one or more of the one or more tuning control signals comprise at least one subsequent value determined as a function of one of the one or more subsequent tuning unit adjustment instructions.

In this case, it is for instance possible to say that the control unit generates: for each of the one or more tuning control signals, an initial value determined as a function of one of the one or more initial tuning unit adjustment instructions; and, for one or more of the one or more tuning control signals, at least one subsequent value determined as a function of one of the one or more subsequent tuning unit adjustment instructions.

It is for instance possible that the input port is coupled, directly or indirectly, to a port of the transmission and signal processing unit, said port of the transmission and signal processing unit delivering the excitation.

Said single-input-port and single-output-port tuning unit comprises an input port and an output port. It is assumed that said single-input-port and single-output-port tuning unit behaves, at said given frequency, with respect to its input port and output port, substantially as a passive linear device, where "passive" is used in the meaning of circuit theory. More precisely, said single-input-port and single-output-port tuning unit behaves, at said given frequency, with respect to the output port and the input port, substantially as a passive linear 2-port device. As a consequence of linearity, it is possible to define the impedance presented by the input port. As a consequence of passivity, the single-input-port and single-output-port tuning unit does not provide amplification, its power gain is less than or equal to 1 and its transducer power gain is less than or equal to 1. The specialist understands that this linearity with respect to the input port and the output port does not contradict the above-mentioned nonlinearity of the performance variable with respect to the one or more inputs of the controlled system (since one may consider that each input of the controlled system is one of the one or more tuning control signals).

The single-input-port and single-output-port tuning unit may for instance be such that the reactance of any one of the one or more adjustable impedance devices of the tuning unit has an influence on an impedance presented by the input port.

For instance, it is possible that the apparatus for radio communication is such that either open-loop control, or closed-loop control, is utilized to determine each of the one or more antenna adjustment instructions and to deliver each of the one or more antenna control signals.

The specialist understands that the apparatus for radio communication of the invention is adaptive in the sense that each of said parameters and the reactances of the one or more adjustable impedance devices of the tuning unit can be automatically varied with time as a function of the one or more sensing unit output signals, which are each mainly determined by one or more electrical variables.

BRIEF DESCRIPTION OF THE DRAWINGS

Other advantages and characteristics will appear more clearly from the following description of particular embodiments of the invention, given by way of non-limiting examples, with reference to the accompanying drawings in which:

FIG. 20 shows a flowchart implemented in an apparatus for radio communication of the invention (fifteenth embodiment);

FIG. 21 shows a flowchart implemented in an apparatus for radio communication of the invention (sixteenth embodiment);

DETAILED DESCRIPTION OF SOME EMBODIMENTS

First Embodiment

Figure 3:
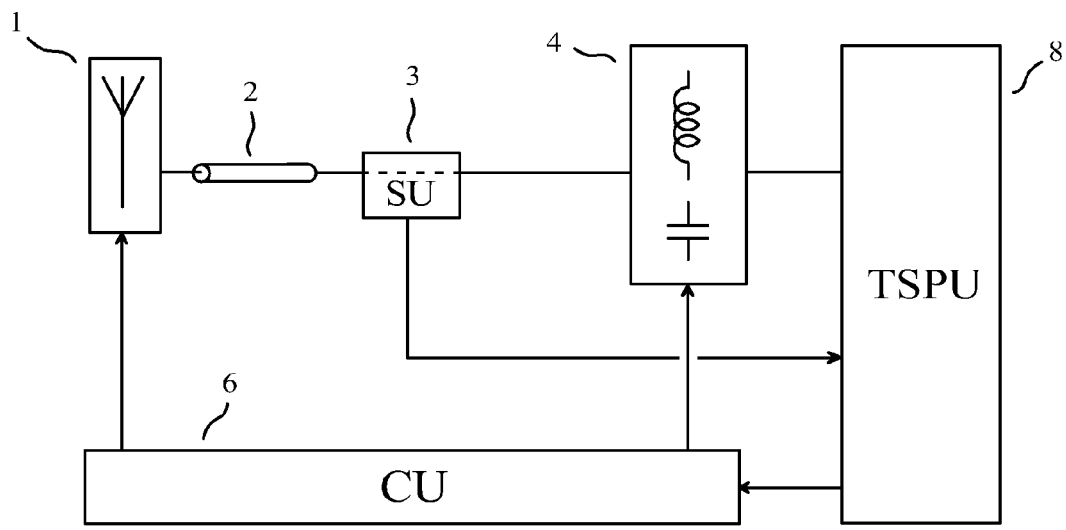
FIG. 3 shows a block diagram of an apparatus for radio communication of the invention (first embodiment)

As a first embodiment of a device of the invention, given by way of non-limiting example, we have represented in FIG. 3 the block diagram of an apparatus for radio communication comprising:

a tunable passive antenna (1), the tunable passive antenna comprising at least one antenna control device, one or more characteristics of said tunable passive antenna being controlled by utilizing said at least one antenna control device, said at least one antenna control device having at least one parameter having an influence on said one or more characteristics, said at least one parameter being adjustable by electrical means;

a single-input-port and single-output-port tuning unit (4) having an input port and an output port, the single-input-port and single-output-port tuning unit comprising p adjustable impedance devices, where p is an integer greater than or equal to two, the p adjustable impedance devices being referred to as "the one or more adjustable impedance devices of the tuning unit" and being such that, at a given frequency greater than or equal to 30 MHz, each of the one or more adjustable impedance devices of the tuning unit has a reactance, the reactance of any one of the one or more adjustable impedance devices of the tuning unit being adjustable by electrical means;

a sensing unit (3), the sensing unit delivering two "sensing unit output signals", each of the sensing unit output signals being mainly determined by an electrical variable sensed (or measured) at the output port while an excitation is applied to the input port;

a feeder (2) having a first end which is directly coupled to a signal port of the tunable passive antenna, the feeder having a second end which is indirectly coupled to the output port, through the sensing unit;

a transmission and signal processing unit (8), the transmission and signal processing unit delivering one or more "antenna adjustment instructions", the transmission and signal processing unit applying the excitation to the input port, the excitation having a carrier frequency referred to as "the carrier frequency of the excitation", the transmission and signal processing unit estimating q real quantities depending on an impedance seen by the output port, where q is an integer greater than or equal to 2, by utilizing the sensing unit output signals, the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of one or more of the q real quantities depending on an impedance seen by the output port, at least one of the tuning unit adjustment instructions being a "subsequent tuning unit adjustment instruction", each of the one or more subsequent tuning unit adjustment instructions being determined by utilizing an extremum-seeking control algorithm, the extremum-seeking control algorithm seeking to either maximize or minimize a performance variable, the performance variable being estimated as a function of one or more of the sensing unit output signals;

a control unit (6), the control unit receiving the one or more antenna adjustment instructions, the control unit delivering one or more "antenna control signals" to the tunable passive antenna, each of the one or more antenna control signals being determined as a function of at least one of the one or more antenna adjustment instructions, each of said parameters being mainly determined by at least one of the one or more antenna control signals, the control unit receiving the tuning unit adjustment instructions, the control unit delivering one or more "tuning control signals" to the single-input-port and single-output-port tuning unit, the control unit generating, for each of the one or more tuning control signals, one or more values of said each of the one or more tuning control signals, each of said one or more values of said each of the one or more tuning control signals being determined as a function of at least one of the tuning unit adjustment instructions, the reactance of each of the one or more adjustable impedance devices of the tuning unit being mainly determined by at least one of the one or more tuning control signals.

The tunable passive antenna is indirectly coupled to the output port. More precisely, the signal port of the tunable passive antenna is indirectly coupled to the output port, through the sensing unit and the feeder. Moreover, the output port is indirectly coupled to the tunable passive antenna. More precisely, the output port is indirectly coupled to the signal port of the tunable passive antenna, through the sensing unit and the feeder.

The sensing unit (3) may for instance be such that the sensing unit output signals comprise: a first sensing unit output signal proportional to a first electrical variable, the first electrical variable being a voltage across the output port; and a second sensing unit output signal proportional to a second electrical variable, the second electrical variable being a current flowing out of the output port. Said voltage across the output port may be a complex voltage and said current flowing out of the output port may be a complex current. Alternatively, the sensing unit (3) may for instance be such that the sensing unit output signals comprise: a first sensing unit output signal proportional to a first electrical variable, the first electrical variable being an incident voltage (which may also be referred to as "forward voltage") at the output port; and a second sensing unit output signal proportional to a second electrical variable, the second electrical variable being a reflected voltage at the output port. Said incident voltage at the output port may be a complex incident voltage and said reflected voltage at the output port may be a complex reflected voltage.

The input port is directly coupled to a port of the transmission and signal processing unit (8), said port of the transmission and signal processing unit delivering the excitation. Each of the one or more antenna adjustment instructions may be of any type of digital message. Each of the tuning unit adjustment instructions may be of any type of digital message. The one or more antenna adjustment instructions and the tuning unit adjustment instructions are delivered during one or more adjustment sequences. Four different adjustment sequences are described below, in the fourth embodiment, in the fifth embodiment, in the sixth embodiment and in the seventh embodiment. The duration of an adjustment sequence is less than 100 microseconds.

For instance, it is possible that the excitation is an unmodulated carrier, the carrier frequency of the excitation being the frequency of said carrier. In this case, the excitation may be a sinusoidal signal whose frequency is the frequency of said carrier. For instance, it is possible that the excitation is an amplitude modulated carrier, the carrier frequency of the excitation being the frequency of said carrier. In this case, the excitation may be an amplitude modulated sinusoidal signal. For instance, it is possible that the excitation is a frequency modulated carrier, the carrier frequency of the excitation being the frequency of said carrier. In this case, the excitation may be a frequency modulated sinusoidal signal. For instance, as explained in the third embodiment, it is possible that the excitation is a bandpass signal, the carrier frequency of the excitation being a carrier frequency of said bandpass signal.

The value of the carrier frequency of the excitation lies in a "set of possible values of the carrier frequency of the excitation", which comprises several elements. The carrier frequency of the excitation may take on any value selected in the set of possible values of the carrier frequency of the excitation.

The single-input-port and single-output-port tuning unit (4) is such that it can provide, at said given frequency, for suitable values of the one or more tuning control signals, a low-loss transfer of power from the input port to the output port, and a low-loss transfer of power from the output port to the input port.

The output port being indirectly coupled to the tunable passive antenna, the specialist sees that the apparatus for radio communication allows, at the given frequency, a transfer of power from the input port to an electromagnetic field radiated by the tunable passive antenna. Thus, the apparatus for radio communication is such that, if a power is received by the input port at the given frequency, a part of said power received by the input port is transferred to an electromagnetic field radiated by the tunable passive antenna at the given frequency, so that a power of the electromagnetic field radiated by the tunable passive antenna at the given frequency is equal to said part of said power received by the input port. The apparatus for radio communication also allows, at the given frequency, a transfer of power from an electromagnetic field incident on the tunable passive antenna to the input port. Additionally, the single-input-port and single-output-port tuning unit (4) and the tunable passive antenna (1) are such that, at said given frequency, for suitable values of the one or more tuning control signals and of the one or more antenna control signals, a low-loss transfer of power from the input port to an electromagnetic field radiated by the tunable passive antenna can be obtained (for radio emission), and a low-loss transfer of power from an electromagnetic field incident on the tunable passive antenna to the input port can be obtained (for radio reception). Thus, it is possible to say that the apparatus for radio communication allows, at the given frequency, for suitable values of the one or more tuning control signals and of the one or more antenna control signals, a low-loss transfer of power from the input port to an electromagnetic field radiated by the tunable passive antenna, and a low-loss transfer of power from an electromagnetic field incident on the tunable passive antenna to the input port.

The suitable values of the one or more tuning control signals and of the one or more antenna control signals are provided automatically. Thus, the specialist understands that any small variation in the impedance seen by the output port can be at least partially compensated with a new automatic adjustment of the tunable passive antenna and of the one or more adjustable impedance devices of the tuning unit.

The apparatus for radio communication is a portable radio transceiver, so that the transmission and signal processing unit (8) also performs functions which have not been mentioned above, and which are well known to specialists. For instance, the apparatus for radio communication can be a user equipment (UE) of an LTE-advanced wireless network.

The specialist understands that $Z_{Sant}$ depends on the frequency and on the electromagnetic characteristics of the volume surrounding the tunable passive antenna. In particular, the body of the user has an effect on $Z_{Sant}$, and $Z_{Sant}$ depends on the position of the body of the user. This is referred to as "user interaction", or "hand effect" or "finger effect". The specialist understands that the apparatus for radio communication may automatically compensate a variation in $Z_{Sant}$ caused by a variation in a frequency of operation, and/or automatically compensate the user interaction.

In order to respond to variations in the electromagnetic characteristics of the volume surrounding the tunable passive antenna and/or in the frequency of operation, a new adjustment sequence starts shortly after each change of the frequency of operation, and no later than 10 milliseconds after the beginning of the previous adjustment sequence.

Second Embodiment

The second embodiment of a device of the invention, given by way of non-limiting example, also corresponds to the apparatus for radio communication shown in FIG. 3, and all explanations provided for the first embodiment are applicable to this second embodiment.

In this second embodiment, the excitation comprises a sinusoidal signal whose frequency is the carrier frequency of the excitation. As explained above, the carrier frequency of the excitation may take on any value lying in the set of possible values of the carrier frequency of the excitation.

The excitation being not amplitude modulated, the excitation alone does not cause variations, as a function of time, of the absolute value of a complex voltage across the output port, of the absolute value of a complex current flowing out of the output port, of the absolute value of a complex incident voltage at the output port, of an average power delivered by the output port, etc. The specialist understands that, consequently:

the performance variable may for instance be substantially the output of a passive peak detector providing a positive voltage which is an increasing function of the absolute value of the complex voltage across the output port, a maximization of this performance variable maximizing an average power delivered by the output port;

the performance variable may for instance be substantially the product of a positive constant and an average of the square of the instantaneous current flowing out of the output port, estimated by utilizing one or more of the sensing unit output signals, a maximization of this performance variable maximizing an average power delivered by the output port;

the performance variable may for instance be substantially the product of a positive constant and the square of an average of the absolute value of the instantaneous voltage across the output port, a maximization of this performance variable maximizing an average power delivered by the output port;

the performance variable may for instance be substantially the product of a negative constant and an average of the absolute value of the instantaneous voltage across the output port, a minimization of this performance variable maximizing an average power delivered by the output port; and the performance variable may for instance be substantially the product of a positive constant and the output of a low-pass filter receiving at its input the square of an instantaneous incident voltage at the output port, a maximization of this performance variable maximizing an average power delivered by the output port.

Thus, the performance variable may be such that the extremum-seeking control algorithm substantially maximizes an average power delivered by the output port while the excitation is applied to the input port.

The specialist notes that a possible performance variable is substantially the image, under a function, of the absolute value of a complex envelope of an electrical variable sensed at the output port, the function being differentiable and strictly monotone over the set of nonnegative real numbers. The specialist also notes that, if said port of the transmission and signal processing unit, which is coupled to the input port and which applies the excitation to the input port, substantially behaves as a port of an active linear two-terminal circuit element, then maximizing an average power delivered by the output port is equivalent to maximizing a transducer power gain of the single-input-port and single-output-port tuning unit.

Thus, the performance variable may be such that the extremum-seeking control algorithm seeks to maximize a transducer power gain of the single-input-port and single-output-port tuning unit.

In this second embodiment, q=2 and the q real quantities depending on an impedance seen by the output port fully determine an impedance seen by the output port (that is to say: they are sufficient for allowing a computation of a real part of the impedance seen by the output port and of an imaginary part of this impedance). For instance, in the case where the two sensing unit output signals are proportional to a voltage across the output port and to a current flowing out of the output port, respectively, and in the case where the two sensing unit output signals are proportional to an incident voltage at the output port and to a reflected voltage at the output port, respectively, the specialist understands how the transmission and signal processing unit can process the sensing unit output signals caused by the excitation, to obtain q real quantities depending on an impedance seen by the output port which fully determine the impedance seen by the output port at the carrier frequency of the excitation. The transmission and signal processing unit may for instance perform an in-phase/quadrature (I/Q) demodulation (homodyne reception) of these sensing unit output signals, to obtain four analog signals. These analog signals may then be converted into digital signals and further processed in the digital domain, to estimate the real part of $Z_{Sant}$ and the imaginary part of $Z_{Sant}$. Thus, said q real quantities depending on an impedance seen by the output port may consist of a real number proportional to the real part of $Z_{Sant}$ and of a real number proportional to the imaginary part of $Z_{Sant}$. Alternatively, said q real quantities depending on an impedance seen by the output port may consist of a real number proportional to the absolute value of $Z_{Sant}$ and of a real number proportional to the argument of $Z_{Sant}$.

Each of the tuning unit adjustment instructions has no influence on the carrier frequency of the excitation, and on the impedance seen by the output port at the carrier frequency of the excitation. Each of the one or more initial tuning unit adjustment instructions is determined as a function of one or more of said q real quantities depending on an impedance seen by the output port, and as a function of one or more quantities depending on the carrier frequency of the excitation. Moreover, each of the one or more initial tuning unit adjustment instructions is determined only as a function of one or more of said q real quantities depending on an impedance seen by the output port, and of one or more quantities depending on the carrier frequency of the excitation. Thus, it is clear that the apparatus for radio communication is such that open-loop control is utilized to determine each of the one or more initial tuning unit adjustment instructions.

In this second embodiment, the control unit is such that, for each of the one or more tuning control signals, said one or more values of said each of the one or more tuning control signals comprise an initial value determined as a function of the one or more initial tuning unit adjustment instructions, and only as a function of the one or more initial tuning unit adjustment instructions. Thus, it is clear that the apparatus for radio communication is such that, for each of the one or more tuning control signals, the initial value of said each of the one or more tuning control signals is generated as a function of one or more of said q real quantities depending on an impedance seen by the output port, and as a function of one or more quantities depending on the carrier frequency of the excitation, open-loop control being utilized to generate the initial value of said each of the one or more tuning control signals.

Consequently, to generate and deliver the one or more tuning control signals, this second embodiment combines an open-loop control scheme and a closed-loop control scheme using one or more electrical variables sensed at the output port. More precisely, the method used to deliver the one or more tuning control signals comprises:

a step of generating, for each of the one or more tuning control signals, an initial value of said each of the one or more tuning control signals, as a function of the one or more initial tuning unit adjustment instructions, this step utilizing an open-loop control scheme, in which one or more of said q real quantities depending on an impedance seen by the output port and said one or more quantities depending on the carrier frequency of the excitation are used to obtain the one or more initial values of the one or more tuning control signals, the one or more initial values of the one or more tuning control signals having no influence on the carrier frequency of the excitation and on $Z_{Sant}$; and a step of generating, for one or more of the one or more tuning control signals, at least one subsequent value of each of said one or more of the one or more tuning control signals, as a function of the one or more subsequent tuning unit adjustment instructions, this step utilizing an extremum-seeking control algorithm, which uses a closed-loop control scheme.

The specialist understands that the characteristics of the open-loop control scheme and of the closed-loop control scheme interact to provide the accuracy and the speed of the automatic adjustment of the single-input-port and single-output-port tuning unit, and to avoid that the extremum-seeking control algorithm converges to a local extremum which is not the wanted global extremum. However, to a limited extent, it may be possible to consider that, in the second embodiment, the high accuracy of the automatic adjustment of the single-input-port and single-output-port tuning unit is mainly obtained with said step of generating, for one or more of the one or more tuning control signals, at least one subsequent value of each of said one or more of the one or more tuning control signals (closed-loop control scheme), and that the high speed of this automatic adjustment is mainly a consequence of the use of said step of generating, for each of the one or more tuning control signals, an initial value of said each of the one or more tuning control signals (open-loop control scheme). In particular, a faster adjustment of the single-input-port and single-output-port tuning unit may typically be obtained if the initial values of the one or more tuning control signals are closer to the values corresponding to the wanted extremum (maximum or minimum) of the performance variable.

Figure 1:
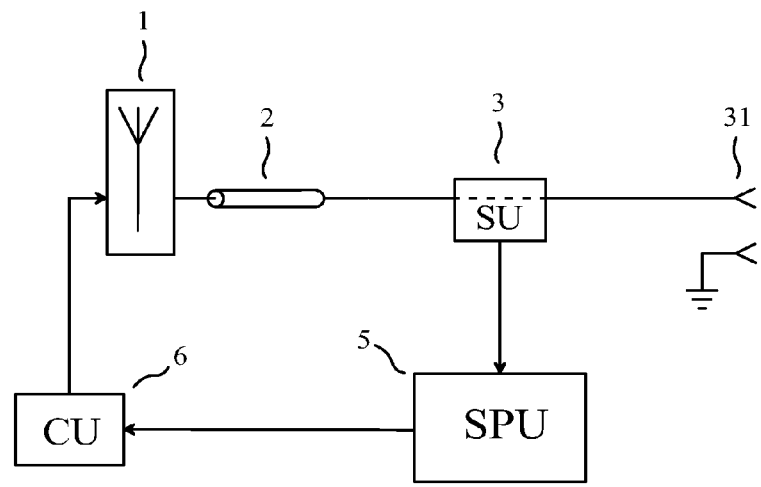
FIG. 1 shows a block diagram of an automatic antenna system, and has already been discussed in the section dedicated to the presentation of the prior art.
Figure 2:
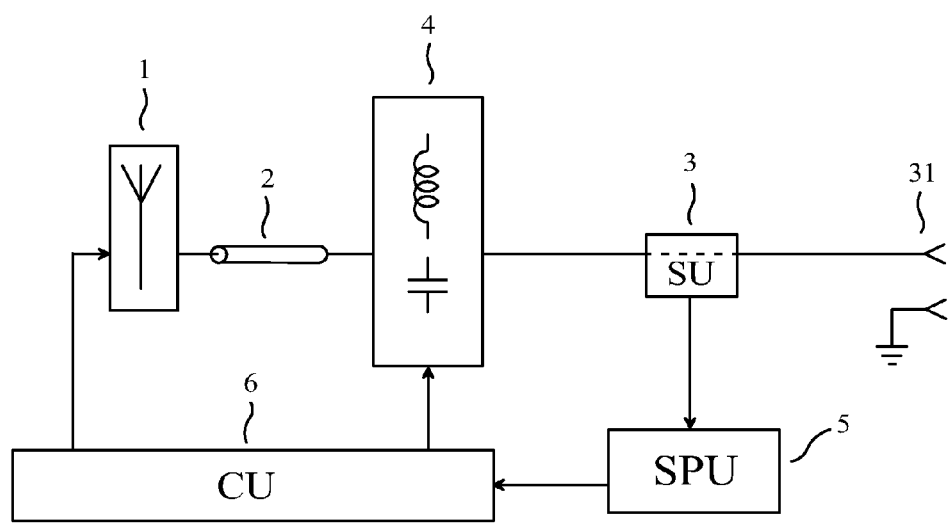
FIG. 2 shows a block diagram of an automatic antenna system, and has already been discussed in the section dedicated to the presentation of the prior art.

The specialist sees a fundamental difference between the prior art method implemented in the automatic antenna system shown in FIG. 2, on the one part, and the second embodiment, on the other part. In said prior art method, real quantities depending on the impedance presented by the user port are used for automatically adjusting the impedance presented by the user port. This means that said prior art method uses a closed-loop control scheme, in which the real quantities depending on the impedance presented by the user port are used to obtain control signals, which determine the reactance of each of the one or more adjustable impedance devices of the tuning unit, and which therefore determine the impedance presented by the user port. In contrast, to deliver the one or more tuning control signals, the second embodiment combines an open-loop control scheme and a closed-loop control scheme, the closed-loop control scheme utilizing an extremum-seeking control algorithm which seeks to maximize or to minimize a performance variable estimated as a function of one or more sensing unit output signals mainly determined by one or more electrical variables sensed at the output port.

Third Embodiment

The third embodiment of a device of the invention, given by way of non-limiting example, also corresponds to the apparatus for radio communication shown in FIG. 3, and all explanations provided for the first embodiment are applicable to this third embodiment.

A bandpass signal is sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\,S(f_C+f)$ in this interval, where k is a real constant which is chosen equal to the square root of 2 by some authors.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible. The complex envelope of the real signal s(t) clearly depends on the choice of a carrier frequency $f_C$. However, for a given carrier frequency, the complex envelope of the real signal s(t) is uniquely defined, for a given choice of the real constant k.

The excitation is produced by the transmission and signal processing unit, from a modulating signal $s_M(t)$. The excitation is a bandpass signal s(t), of carrier frequency $f_C$, whose complex envelope $s_B(t)$ is, for any fixed value of $Z_U$, substantially proportional to the modulating signal. The specialist knows that such an excitation may for instance be obtained:

as the result of a phase and/or amplitude modulation of a single carrier at the frequency $f_C$;

as a linear combination of a first signal and a second signal, the first signal being the product of the real part of the modulating signal and a first sinusoidal carrier of frequency $f_c$, the second signal being the product of the imaginary part of the modulating signal and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

The excitation being a bandpass signal, it is possible to show that, if the bandwidth of the excitation is sufficiently narrow, then any voltage or current measured at the output port and caused by the excitation is a bandpass signal, a complex envelope of which is proportional to the complex envelope of the excitation, the coefficient of proportionality being complex and time-independent. Thus, we may consider that the excitation causes, at the output port: a current flowing out of the output port, of complex envelope $i_{TP}(t)$; and a voltage across the output port, of complex envelope $v_{TP}(t)$. If the bandwidth of the complex envelope of the excitation is sufficiently narrow, we have $$v_{TP}(t)=Z_{Sant}i_{TP}(t) \quad (1)$$

where $Z_{Sant}$ is the impedance seen by the output port, at the carrier frequency.

The q real quantities depending on an impedance seen by the output port fully determine the impedance seen by the output port. Also, the two sensing unit output signals are proportional to a voltage across the output port and to a current flowing out of the output port, respectively, as explained above. The specialist understands how the transmission and signal processing unit can process the sensing unit output signals caused by the excitation and obtained while the excitation is being applied, to obtain q real quantities depending on an impedance seen by the output port which fully determine the impedance seen by the output port. According to a first example, the transmission and signal processing unit may perform a down-conversion of the sensing unit output signals, followed by an in-phase/quadrature (I/Q) demodulation (heterodyne reception), to obtain four analog signals, proportional to the real part of $v_{TP}(t)$, the imaginary part of $v_{TP}(t)$, the real part of $i_{TP}(t)$, and the imaginary part of $i_{TP}(t)$, respectively. These analog signals may then be converted into digital signals and further processed in the digital domain, based on equation (1), to estimate the absolute value of the admittance seen by the output port, and the phase of the admittance seen by the output port. According to a second example, the transmission and signal processing unit may perform a down-conversion of all sensing unit output signals, followed by a conversion into digital signals using bandpass sampling, and by a digital quadrature demodulation, to obtain four digital signals: the samples of the real part of $v_{TP}(t)$; the samples of the imaginary part of $v_{TP}(t)$; the samples of the real part of $i_{TP}(t)$; and the samples of the imaginary part of $i_{TP}(t)$. These digital signals may then be further processed, based on equation (1), to estimate the absolute value of the admittance seen by the output port, and the phase of the admittance seen by the output port.

If the absolute value of the modulating signal does not vary as a function of time, the excitation is not amplitude modulated, and the excitation alone does not cause variations, as a function of time, of the absolute value of a complex voltage across the output port, of the absolute value of a complex current flowing out of the output port, of the absolute value of a complex incident voltage at the output port, of an average power delivered by the output port, etc. The specialist understands that, in this case, each of the performance variables mentioned as examples in the second embodiment may, for instance, be used in this third embodiment.

If the absolute value of the modulating signal varies as a function of time, the excitation is amplitude modulated, and the excitation alone causes variations, as a function of time, of the absolute value of a complex voltage across the output port, of the absolute value of a complex current flowing out of the output port, of the absolute value of a complex incident voltage at the output port, of an average power delivered by the output port, etc. In this case, none of the performance variables mentioned as examples in the second embodiment is appropriate. However, the specialist understands that the excitation alone does not cause variations, as a function of time, of a performance variable which is inversely proportional to a suitable function of the absolute value of the modulating signal. Thus, the specialist understands that, in the case where the absolute value of the modulating signal varies as a function of time and is never zero (and also in the case where the absolute value of the modulating signal does not vary as a function of time):

the performance variable may for instance (example A) be substantially a product of three terms, this product being the product of a positive constant, an average of the square of the instantaneous current flowing out of the output port, and the inverse of the square of the absolute value of the modulating signal, a maximization of this performance variable maximizing an average power delivered by the output port;

the performance variable may for instance (example B) be substantially a product of three terms, this product being the product of a negative constant, an average of the absolute value of the instantaneous voltage across the output port, and the inverse of the absolute value of the modulating signal, a minimization of this performance variable maximizing an average power delivered by the output port;

the performance variable may for instance (example C) be substantially a product of three terms, this product being the product of a positive constant, the output of a first low-pass filter receiving at its input the square of an instantaneous incident voltage at the output port, and the inverse of the output of a second low-pass filter receiving at its input the square of the absolute value of the modulating signal, a maximization of this performance variable maximizing an average power delivered by the output port.

The specialist understands that it is for instance possible, in the case of the example A, to easily obtain an analog signal substantially equal to the product of a positive constant and an average of the square of the instantaneous current flowing out of the output port, to convert this analog signal into a digital signal, and to obtain that the transmission and signal processing unit computes a ratio of this digital signal to the square of the absolute value of the modulating signal, this ratio being the wanted performance variable. The specialist understands that it is for instance possible, in the case of the example B, to easily obtain an analog signal substantially equal to the product of a negative constant and an average of the absolute value of the instantaneous voltage across the output port, to convert this analog signal into a digital signal, and to obtain that the transmission and signal processing unit computes a ratio of this digital signal to the absolute value of the modulating signal, this ratio being the wanted performance variable. The specialist understands that it is for instance possible, in the case of the example C, to easily obtain an analog signal substantially equal to the product of a positive constant and the output of an analog low-pass filter (first low-pass filter) receiving at its input the square of an instantaneous incident voltage at the output port, to convert this analog signal into a digital signal, and to obtain that the transmission and signal processing unit computes a ratio of this digital signal to the output of a digital low-pass filter (second low-pass filter) receiving at its input the square of the absolute value of the modulating signal, this ratio being the wanted performance variable.

A performance variable which may be used in the case where the absolute value of the modulating signal varies as a function of time (and also in the case where the absolute value of the modulating signal does not vary as a function of time) is such that, if the absolute value of the modulating signal is not substantially zero, then the performance variable is substantially equal to the ratio of the image, under a function, of an absolute value of the complex envelope of an electrical variable sensed at the output port, to the image, under the function, of an absolute value of the modulating signal, the function being differentiable and strictly monotone over the set of positive real numbers. Said electrical variable sensed at the output port may for instance be a voltage across the output port, a current flowing out of the output port, or a voltage incident at the output port, etc. Let us use $f$ to denote said function. The specialist understands that we may assume that said absolute value of the complex envelope of an electrical variable sensed at the output port is, for given values of the tuning control signals and for a given value of an impedance seen by the output port $Z_{Sant}$, substantially the product of a real constant $\lambda$ and of the absolute value of the modulating signal. The specialist understands that, to obtain that variations of the absolute value of the modulating signal have no effect on the performance variable, it is necessary and sufficient that, for any positive $\lambda$, the ratio $f(\lambda|s_M(t)|)/f(|s_M(t)|)$ is independent of $|s_M(t)|$. The function $f$ must therefore be such that, for any positive number $\lambda$ and for any positive number x, we have $$\frac{f(\lambda x)}{f(x)} = \frac{f(\lambda)}{f(1)} \quad (2)$$

so that $$f(\lambda x) = \frac{f(x)f(\lambda)}{f(1)} \quad (3)$$

Taking a partial derivative of the equation (3) with respect to the variable x, and a partial derivative of the equation (3) with respect to the variable $\lambda$, we obtain, after some manipulations, the differential equation $$\frac{f'(x)}{f(x)} = \frac{1}{x}\frac{f'(1)}{f(1)} \quad (4)$$

in which $f'$ is the derivative of $f$. The differential equation (4) is not a linear differential equation. The solutions of the differential equation (4) are the functions which satisfy $$f(x)=Kx^k \quad (5)$$

where k and K are real constants, K being nonzero. Conversely, we see that all functions given by (5) satisfy the equation (2), and are strictly monotone for k nonzero. Thus, we have shown that the function $f$ is such that the image of a positive variable under $f$ is equal to the product of a nonzero real constant and the variable raised to a constant nonzero real power. It is possible to consider that the example A corresponds to k=2 and K>0, and that the example B corresponds to k=1 and K<0.

More generally, we see that, if the excitation is produced by the transmission and signal processing unit from a modulating signal, the performance variable may be estimated as a function of one or more of the one or more sensing unit output signals and as a function of the modulating signal. In particular, the performance variable may be such that: the performance variable is substantially proportional to the image, under a function, of an absolute value of a complex envelope of an electrical variable sensed at the output port, the function being differentiable and strictly monotone over the set of positive real numbers; and such that, if an absolute value of the modulating signal is not substantially zero, then the performance variable is substantially inversely proportional to the image of the absolute value of the modulating signal under the function. This characteristic is advantageous because, as shown above, it may be such that variations of the absolute value of the modulating signal have no effect on the performance variable.

Fourth Embodiment

Figure 4:
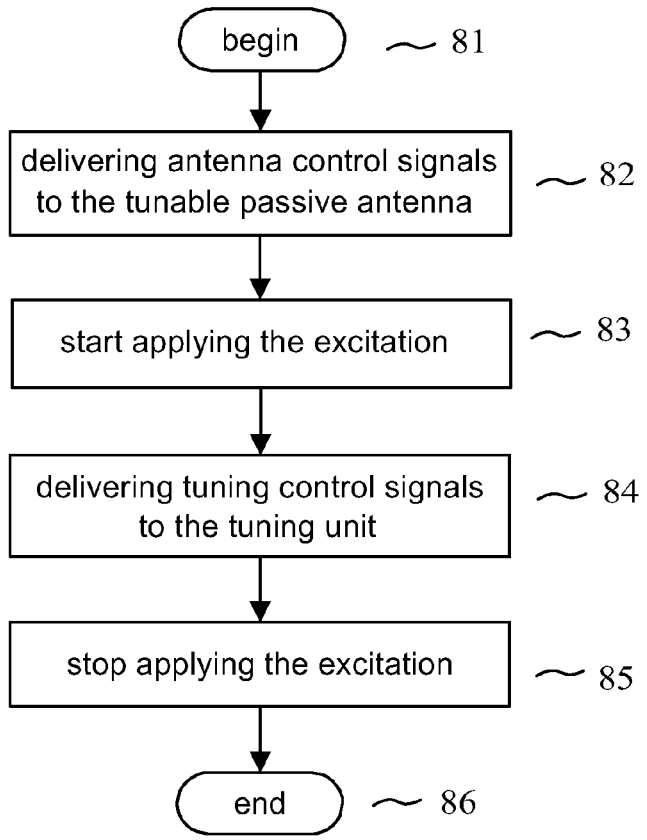
FIG. 4 shows a flowchart implemented in an apparatus for radio communication of the invention (fourth embodiment)

The fourth embodiment of a device of the invention, given by way of non-limiting example, also corresponds to the apparatus for radio communication shown in FIG. 3, and all explanations provided for the first embodiment are applicable to this fourth embodiment. A flowchart of one of the one or more adjustment sequences used in this fourth embodiment is shown in FIG. 4. Before the beginning of said one of the one or more adjustment sequences, a "selected frequency" has been chosen by the transmission and signal processing unit in the set of possible values of the carrier frequency of the excitation. In addition to the begin symbol (81) and the end symbol (86), said flowchart comprises:
- a process "delivering antenna control signals to the tunable passive antenna" (82), in which the transmission and signal processing unit delivers one or more of the one or more antenna adjustment instructions, and in which the control unit delivers said one or more antenna control signals to the tunable passive antenna, each of said one or more of the one or more antenna adjustment instructions being determined as a function of the selected frequency;
- a process "start applying the excitation" (83), in which the transmission and signal processing unit starts applying the excitation to the input port, said excitation having a carrier frequency which is equal to the selected frequency, so that the sensing unit becomes able to deliver two sensing unit output signals determined by electrical variables sensed at the output port while the excitation is applied to the input port;

a process "delivering tuning control signals to the tuning unit" (84), in which the transmission and signal processing unit delivers one or more of the tuning unit adjustment instructions, and in which the control unit delivers said one or more tuning control signals to the single-input-port and single-output-port tuning unit; and a process "stop applying the excitation" (85), in which the transmission and signal processing unit stops applying the excitation to the input port.

The selected frequency may take on any value in the set of possible values of the carrier frequency of the excitation. Each of the one or more antenna control signals has no influence on the selected frequency. Each of the one or more antenna adjustment instructions has no influence on the selected frequency. Each of said one or more of the one or more antenna adjustment instructions being determined as a function of the selected frequency, and only as a function of the selected frequency, it is clear that open-loop control is utilized to obtain each of the one or more antenna adjustment instructions, and that open-loop control is utilized to obtain each of the one or more antenna control signals.

In this fourth embodiment, the one or more antenna adjustment instructions and the one or more antenna control signals are such that:

at the end of the process "delivering antenna control signals to the tunable passive antenna" (82), the impedance seen by the output port approximates a specified impedance, which may depend on frequency; and each said at least one parameter of each said at least one antenna control device of the tunable passive antenna has a value which does not change from the end of the process "delivering antenna control signals to the tunable passive antenna" (82) to the end (86) of said one of the one or more adjustment sequences.

To obtain that, at the end of the process "delivering antenna control signals to the tunable passive antenna" (82), the impedance seen by the output port approximates the specified impedance, the transmission and signal processing unit uses an algorithm to determine and deliver the one or more antenna adjustment instructions. The algorithm uses the selected frequency and some properties of the tunable passive antenna. For instance, the algorithm may be based on a formula allowing one to estimate the impedance seen by the output port $Z_{Sant}$ in an assumed use configuration, as a function of the selected frequency and of each said at least one parameter of each said at least one antenna control device of the tunable passive antenna, the formula being possibly used to compute, for the assumed use configuration, an optimal value of each said at least one parameter of each said at least one antenna control device of the tunable passive antenna, at the selected frequency. For instance, the algorithm may be based on one or more formulas allowing one to estimate, in an assumed use configuration, an optimal value of each said at least one parameter of each said at least one antenna control device of the tunable passive antenna, as a function of the selected frequency. The specialist knows how to write such an algorithm, and he understands that such an algorithm cannot take into account the variations of $Z_{Sant}$ caused by variations in the electromagnetic characteristics of the volume surrounding the tunable passive antenna. Moreover, as said above in the prior art section, tunable passive antennas often only provide a poor tuning capability. Consequently, at the end of the process "delivering antenna control signals to the tunable passive antenna" (82), the impedance seen by the output port typically only very coarsely approximates the specified impedance.

Figure 5:
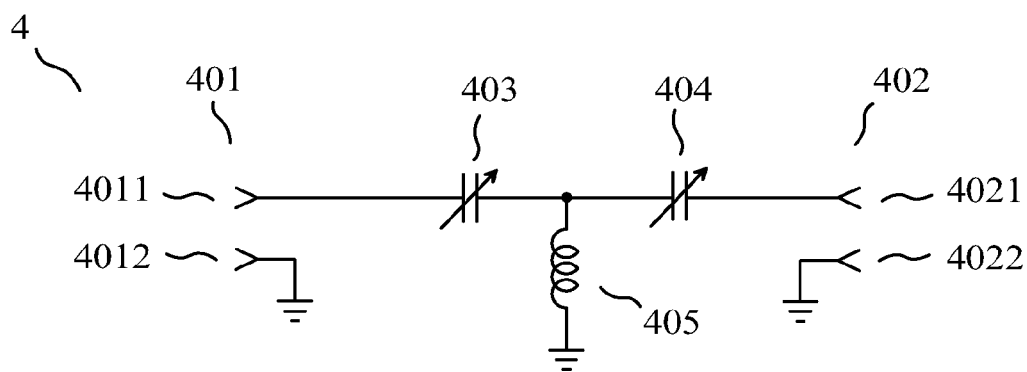
FIG. 5 shows a schematic diagram of a single-input-port and single-output-port tuning unit, which may be used in the apparatus for radio communication shown in FIG. 3 (fourth embodiment)

We have represented in FIG. 5 the single-input-port and single-output-port tuning unit (4) used in this fourth embodiment. This single-input-port and single-output-port tuning unit comprises:

an output port (401) having two terminals (4011) (4012), the output port being single-ended;

an input port (402) having two terminals (4021) (4022), the input port being single-ended;

one of the one or more adjustable impedance devices of the tuning unit (403), presenting a negative reactance and having a terminal connected to a terminal of the output port;

one of the one or more adjustable impedance devices of the tuning unit (404), presenting a negative reactance and having a terminal connected to a terminal of the input port; and a winding (405), having a first terminal coupled to ground, and having a second terminal coupled to a terminal of each of the one or more adjustable impedance devices of the tuning unit (403) (404).

Each of the one or more adjustable impedance devices of the tuning unit (403) (404) is adjustable by electrical means, but the circuits and the control links needed to determine the reactance of each of the one or more adjustable impedance devices of the tuning unit are not shown in FIG. 5.

The specialist understands that the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port. Moreover, the single-input-port and single-output-port tuning unit has a full tuning capability, the definition of which is given in section III of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015. Thus, the specialist understands that any small variation in the impedance seen by the output port can be completely compensated with a new automatic adjustment of the one or more adjustable impedance devices of the tuning unit; and that the single-input-port and single-output-port tuning unit can be such that it can provide, at said given frequency, for suitable values of the one or more tuning control signals, a low-loss transfer of power from the input port to the output port, and a low-loss transfer of power from the output port to the input port.

In this fourth embodiment, we use p=2 adjustable impedance devices of the tuning unit. Thus, it is possible that p is greater than or equal to 2. As explained in said article entitled "Some Properties of Multiple-Antenna-Port and Multiple-User-Port Antenna Tuners", this is necessary to obtain a full tuning capability.

Figure 6:
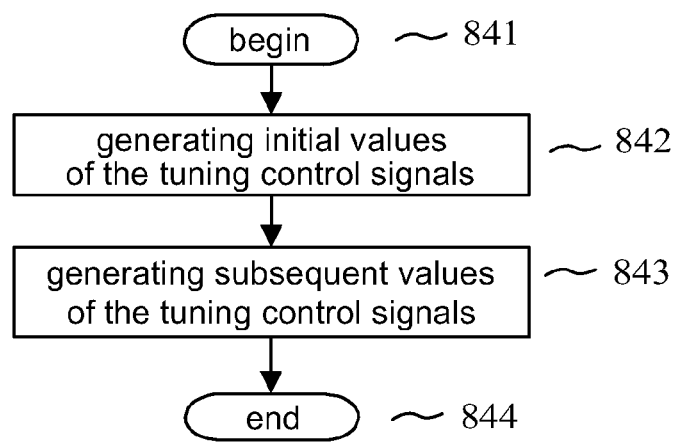
FIG. 6 shows a flowchart implemented in an apparatus for radio communication of the invention (fourth embodiment)

A flowchart of the process "delivering tuning control signals to the tuning unit" (84) is shown in FIG. 6. In addition to the begin symbol (841) and the end symbol (844), this flowchart comprises:

a process "generating initial values of the tuning control signals" (842), in which the transmission and signal processing unit delivers an initial tuning unit adjustment instruction, and in which, for each of the one or more tuning control signals, the control unit generates a value of said each of the one or more tuning control signals, said value being referred to as initial value, said initial value being determined as a function of the initial tuning unit adjustment instruction, and only as a function of the initial tuning unit adjustment instruction;

a process "generating subsequent values of the tuning control signals" (843), in which the transmission and signal processing unit delivers subsequent tuning unit adjustment instructions, and in which, for each of the one or more tuning control signals and for each of the subsequent tuning unit adjustment instructions, the control unit generates a value of said each of the one or more tuning control signals, said value being referred to as subsequent value, said subsequent value being determined as a function of said each of the subsequent tuning unit adjustment instructions, and only as a function of said each of the subsequent tuning unit adjustment instructions.

The process "generating initial values of the tuning control signals" (842) uses an open-loop control scheme, in which at least two of said q real quantities depending on an impedance seen by the output port, and a quantity depending on the carrier frequency of the excitation, are used to obtain, for each of the one or more tuning control signals, an initial value. In this process, the at least two of said q real quantities depending on an impedance seen by the output port fully determine the impedance seen by the output port, at the carrier frequency of the excitation, after the end of the process "delivering antenna control signals to the tunable passive antenna" (82). In this process, the quantity depending on the carrier frequency of the excitation is the selected frequency (which, as said above, is equal to the carrier frequency of the excitation).

According to a first example of the process "generating initial values of the tuning control signals" (842), said initial tuning unit adjustment instruction is determined based on a model of the single-input-port and single-output-port tuning unit, this model taking into account the influences of the carrier frequency of the excitation, of the at least two of said q real quantities depending on an impedance seen by the output port, and of an initial tuning unit adjustment instruction, on a transducer power gain of the single-input-port and single-output-port tuning unit. The specialist understands that this model may for instance comprise: for each of the one or more adjustable impedance devices of the tuning unit, a lookup table (also spelled "look-up table") about the characteristics of said each of the one or more adjustable impedance devices of the tuning unit; and one or more formulas for computing the transducer power gain. The transmission and signal processing unit estimates the at least two of said q real quantities depending on an impedance seen by the output port, and uses an "open-loop algorithm" to determine the initial tuning unit adjustment instruction, the initial tuning unit adjustment instruction being such that a predicted value of the transducer power gain of the single-input-port and single-output-port tuning unit, determined based on the model, is as high as possible, at the carrier frequency of the excitation. This process requires no difficult computation. This process quickly provides the initial tuning unit adjustment instruction, which is such that a resulting transducer power gain of the single-input-port and single-output-port tuning unit is not very far from a maximum transducer power gain achievable with the single-input-port and single-output-port tuning unit at the carrier frequency of the excitation, because the at least two of said q real quantities depending on an impedance seen by the output port fully determine the impedance seen by the output port, at the carrier frequency of the excitation, after the end of the process "delivering antenna control signals to the tunable passive antenna" (82).

According to a second example of the process "generating initial values of the tuning control signals" (842), a wanted impedance is defined, and said initial tuning unit adjustment instruction is determined based on a model of the single-input-port and single-output-port tuning unit, this model taking into account the influences of the carrier frequency of the excitation, of the at least two of said q real quantities depending on an impedance seen by the output port, and of an initial tuning unit adjustment instruction, on the impedance presented by the input port $Z_U$. The specialist understands that this model may for instance comprise: for each of the one or more adjustable impedance devices of the tuning unit, a lookup table about the characteristics of said each of the one or more adjustable impedance devices of the tuning unit; and one or more formulas for computing the impedance presented by the input port. The transmission and signal processing unit estimates the at least two of said q real quantities depending on an impedance seen by the output port, and uses an "open-loop algorithm" to determine the initial tuning unit adjustment instruction, the initial tuning unit adjustment instruction being such that a predicted absolute value of the difference between the impedance presented by the input port and the wanted impedance, determined based on the model, is as small as possible, at the carrier frequency of the excitation. A first possible open-loop algorithm may for instance use the formulas shown in Section VI of said article entitled "Some Properties of Multiple-Antenna-Port and Multiple-User-Port Antenna Tuners". This first possible open-loop algorithm does not take the losses of the single-input-port and single-output-port tuning unit into account. A second possible open-loop algorithm may for instance use the iterative computation technique presented in Section 4 or Appendix C of the article of F. Broydé and E. Clavelier entitled "A Tuning Computation Technique for a Multiple-Antenna-Port and Multiple-User-Port Antenna Tuner", published in *International Journal of Antennas and Propagation*, in 2016. This second possible open-loop algorithm is more accurate than the first possible open-loop algorithm, because it takes the losses in the single-input-port and single-output-port tuning unit into account. The specialist knows how to write such an algorithm. This process quickly provides the initial tuning unit adjustment instruction, which is such that, at the carrier frequency of the excitation, the impedance presented by the input port is not very far from the wanted impedance, because the at least two of said q real quantities depending on an impedance seen by the output port fully determine the impedance seen by the output port, at the carrier frequency of the excitation, after the end of the process "delivering antenna control signals to the tunable passive antenna" (82).

Unfortunately, the process "generating initial values of the tuning control signals" (842) cannot be very accurate, because it does not take into account the effects of component tolerances, of component aging, and of the component temperatures, on the characteristics of the single-input-port and single-output-port tuning unit.

The process "generating subsequent values of the tuning control signals" (843) is used to substantially maximize an average power delivered by the output port, at the carrier frequency of the excitation. This process is accurate, because it uses an extremum-seeking control algorithm, which is based on a closed-loop control scheme. For instance, this extremum-seeking control algorithm may have the characteristics presented below in the fourteenth embodiment, or in the fifteenth embodiment, or in the sixteenth embodiment, or in the seventeenth embodiment, or in the eighteenth embodiment. This process quickly provides one or more subsequent tuning unit adjustment instructions such that this average power delivered by the output port takes on a value which is very near a maximum value, because this process is started not very far from this maximum value, thanks to a process "generating initial values of the tuning control signals" (842) which takes into account the result of the process "delivering antenna control signals to the tunable passive antenna" (82). In the previous sentence, "maximum value" means the greatest value, of said average power, which may be achieved by only adjusting the single-input-port and single-output-port tuning unit.

The specialist in computation knows that "algorithms for minimization", also known as "minimization algorithms" are used for finding numerical approximations of the minima of a known function. For instance, some minimization algorithms are presented in the well-known book of R. P. Brent, entitled "Algorithms for minimization without derivatives", published by Prentice-Hall in 1973. More minimization algorithms are presented in the chapter 10 of the well-known book of W.H. Press, S. A. Teukolsky, W. T. Vetterling and B. P. Flannery, entitled "Numerical Recipes in Fortran 77—The art of Scientific Computing", Second Edition, published by Cambridge University Press in 1992. Likewise, the specialist in computation knows that "algorithms for maximization", also known as "maximization algorithms" are used for finding numerical approximations of the maxima of a known function. Consequently, the specialist sees fundamental differences between a minimization algorithm or a maximization algorithm, on the one part, and the extremum-seeking control algorithm used in the invention, on the other part: a minimization algorithm or a maximization algorithm autonomously finds an extremum of a known function, without real-time constraint, whereas, as explained above, the extremum-seeking control algorithm autonomously finds, in real-time, a maximum or a minimum of the performance variable, without knowing an exact model of the controlled system (non-model-based optimization approach).

In contrast to the process "generating initial values of the tuning control signals" (842), the process "generating subsequent values of the tuning control signals" (843) is non-model-based and it uses a closed-loop control scheme.

The process "generating initial values of the tuning control signals" (842) and the process "generating subsequent values of the tuning control signals" (843) are such that the adjustment of the single-input-port and single-output-port tuning unit is always optimal or almost optimal, in spite of the presence of losses in the single-input-port and single-output-port tuning unit.

Consequently, this embodiment is a solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small. Moreover, this embodiment provides a much broader tuning range than an automatic tuning system which would comprise the single-input-port and single-output-port tuning unit shown in FIG. 5, but no tunable passive antenna.

Fifth Embodiment

Figure 7:
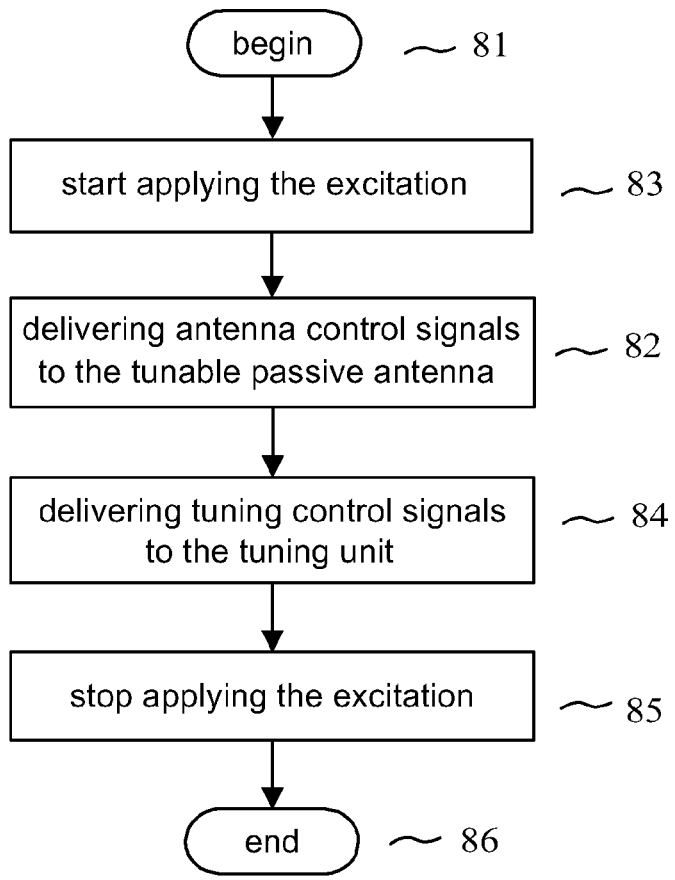
FIG. 7 shows a flowchart implemented in an apparatus for radio communication of the invention (fifth embodiment)

The fifth embodiment of a device of the invention, given by way of non-limiting example, also corresponds to the apparatus for radio communication shown in FIG. 3, and all explanations provided for the first embodiment are applicable to this fifth embodiment. A flowchart of one of the one or more adjustment sequences used in this fifth embodiment is shown in FIG. 7. Before the beginning of said one of the one or more adjustment sequences, a "selected frequency" has been chosen by the transmission and signal processing unit in the set of possible values of the carrier frequency of the excitation. In addition to the begin symbol (81) and the end symbol (86), said flowchart comprises:

a process "start applying the excitation" (83), in which the transmission and signal processing unit starts applying the excitation to the input port, so that the sensing unit becomes able to deliver two sensing unit output signals each determined by an electrical variable sensed at the output port while the excitation is applied to the input port, said excitation having a carrier frequency which is equal to the selected frequency;

a process "delivering antenna control signals to the tunable passive antenna" (82), in which the transmission and signal processing unit delivers one or more of the one or more antenna adjustment instructions, and in which the control unit delivers said one or more antenna control signals to the tunable passive antenna, each of said one or more of the one or more antenna adjustment instructions being determined as a function of one or more of said q real quantities depending on an impedance seen by the output port;

a process "delivering tuning control signals to the tuning unit" (84), in which the transmission and signal processing unit delivers one or more of the tuning unit adjustment instructions, and in which the control unit delivers said one or more tuning control signals to the single-input-port and single-output-port tuning unit; and a process "stop applying the excitation" (85), in which the transmission and signal processing unit stops applying the excitation to the input port.

Each of said one or more of the one or more antenna adjustment instructions being determined as a function of one or more of said q real quantities depending on an impedance seen by the output port, the one or more antenna control signals are delivered as a function of one or more of said q real quantities depending on an impedance seen by the output port.

The tunable passive antenna is such that each said at least one parameter of each said at least one antenna control device of the tunable passive antenna has an effect on the impedance seen by the output port, denoted by $Z_{Sant}$. Since each of said parameters is mainly determined by at least one of the one or more antenna control signals, the one or more antenna control signals have an effect on $Z_{Sant}$. Thus, the process "delivering antenna control signals to the tunable passive antenna" (82) utilizes a closed-loop control scheme, because one or more of the q real quantities depending on an impedance seen by the output port are used to obtain the one or more antenna adjustment instructions, and afterwards the one or more antenna control signals. Thus, it is clear that closed-loop control is utilized to obtain each of the one or more antenna adjustment instructions, and that closed-loop control is utilized to obtain each of the one or more antenna control signals.

In this fifth embodiment, the one or more antenna adjustment instructions and the one or more antenna control signals are such that:

at the end of the process "delivering antenna control signals to the tunable passive antenna" (82), the impedance seen by the output port approximates a specified impedance, which may depend on frequency; and each said at least one parameter of each said at least one antenna control device of the tunable passive antenna has a value which does not change from the end of the process "delivering antenna control signals to the tunable passive antenna" (82) to the end (86) of said one of the one or more adjustment sequences.

To obtain that, at the end of the process "delivering antenna control signals to the tunable passive antenna" (82), the impedance seen by the output port approximates the specified impedance, the transmission and signal processing unit estimates the q real quantities depending on an impedance seen by the output port, and uses an algorithm to determine and deliver the one or more antenna adjustment instructions. The algorithm uses the q real quantities depending on an impedance seen by the output port. For instance, assuming that the q real quantities depending on an impedance seen by the output port fully determine the impedance seen by the output port (so that $Z_{Sant}$ may be computed), the algorithm may be an extremum-seeking control algorithm which seeks to minimize a performance variable by controlling the one or more antenna control signals, the performance variable being an absolute value of the difference between $Z_{Sant}$ and the specified impedance. For instance, the algorithm may use the selected frequency and the q real quantities depending on an impedance seen by the output port. For instance, assuming that the q real quantities depending on an impedance seen by the output port fully determine the impedance seen by the output port, the algorithm may be based on one or more formulas which can be used to estimate an optimal value of each said at least one parameter of each said at least one antenna control device of the tunable passive antenna, as a function of the selected frequency, of the one or more antenna adjustment instructions which were applicable while the sensing unit delivered the sensing unit output signals used to estimate the q real quantities depending on an impedance seen by the output port, and of $Z_{Sant}$. The specialist knows how to write such an algorithm. The specialist understands that such algorithms take into account the variations of $Z_{Sant}$ caused by variations in the electromagnetic characteristics of the volume surrounding the tunable passive antenna. Consequently, the resulting accuracy may be better than the one obtained in the corresponding process of the fourth embodiment. However, as said above in the prior art section, tunable passive antennas often only provide a poor tuning capability, so that, at the end of the process "delivering antenna control signals to the tunable passive antenna" (82), the impedance seen by the output port typically only coarsely approximates the specified impedance.

Sixth Embodiment (Best Mode)

Figure 8:
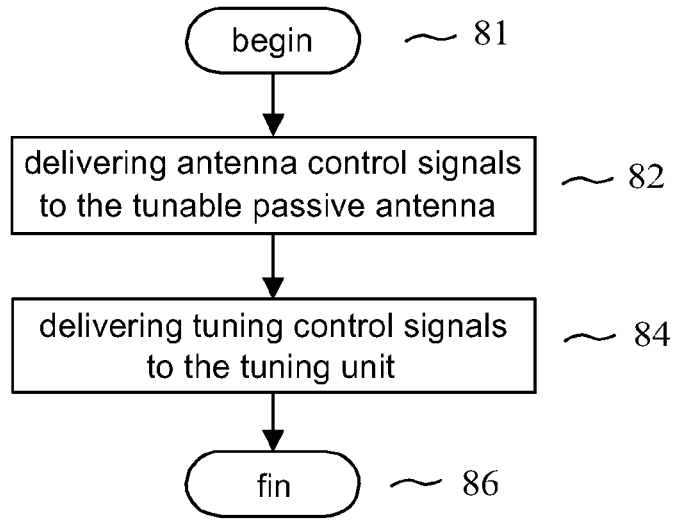
FIG. 8 shows a flowchart implemented in an apparatus for radio communication of the invention (sixth embodiment)

The sixth embodiment of a device of the invention, given by way of non-limiting example and best mode of carrying out the invention, also corresponds to the apparatus for radio communication shown in FIG. 3, and all explanations provided for the first embodiment are applicable to this sixth embodiment. In this sixth embodiment, the excitation is applied continuously, so that the sensing unit can continuously deliver two sensing unit output signals each determined by an electrical variable sensed at the output port while the excitation is applied to the input port. A flowchart of one of the one or more adjustment sequences used in this sixth embodiment is shown in FIG. 8. Before the beginning of said one of the one or more adjustment sequences, a "selected frequency" has been chosen by the transmission and signal processing unit, among the elements of the set of possible values of the carrier frequency of the excitation. Said excitation has, during said one of the one or more adjustment sequences, a carrier frequency which is equal to the selected frequency. In addition to the begin symbol (81) and the end symbol (86), said flowchart comprises:

a process "delivering antenna control signals to the tunable passive antenna" (82), in which the transmission and signal processing unit delivers one or more of the one or more antenna adjustment instructions, and in which the control unit delivers said one or more antenna control signals to the tunable passive antenna, each of said one or more of the one or more antenna adjustment instructions being determined as a function of the selected frequency; and a process "delivering tuning control signals to the tuning unit" (84), in which the transmission and signal processing unit delivers one or more of the tuning unit adjustment instructions, and in which the control unit delivers said one or more tuning control signals to the single-input-port and single-output-port tuning unit.

The selected frequency may take on any value in the set of possible values of the carrier frequency of the excitation. Each of the one or more antenna control signals and each of the one or more antenna adjustment instructions being determined without using a measurement of a controlled variable, it is clear that open-loop control is utilized to obtain each of the one or more antenna adjustment instructions, and each of the one or more antenna control signals.

In this sixth embodiment, the one or more antenna adjustment instructions and the one or more antenna control signals are such that:

at the end of the process "delivering antenna control signals to the tunable passive antenna" (82), the impedance seen by the output port approximates a specified impedance, which may depend on frequency; and each said at least one parameter of each said at least one antenna control device of the tunable passive antenna has a value which does not change from the end of the process "delivering antenna control signals to the tunable passive antenna" (82) to the beginning of an adjustment sequence which follows the end of said one of the one or more adjustment sequences.

To obtain that, at the end of the process "delivering antenna control signals to the tunable passive antenna" (82), the impedance seen by the output port approximates the specified impedance, the transmission and signal processing unit uses a lookup table to determine and deliver the one or more antenna adjustment instructions, as a function of the selected frequency. The specialist knows how to build and use such a lookup table, and he understands that such a lookup table cannot take into account the variations of $Z_{Sant}$ caused by variations in the electromagnetic characteristics of the volume surrounding the tunable passive antenna. Moreover, as said above in the prior art section, tunable passive antennas often only provide a poor tuning capability. Consequently, at the end of the process "delivering antenna control signals to the tunable passive antenna" (82), the impedance seen by the output port typically only very coarsely approximates the specified impedance.

Figure 9:
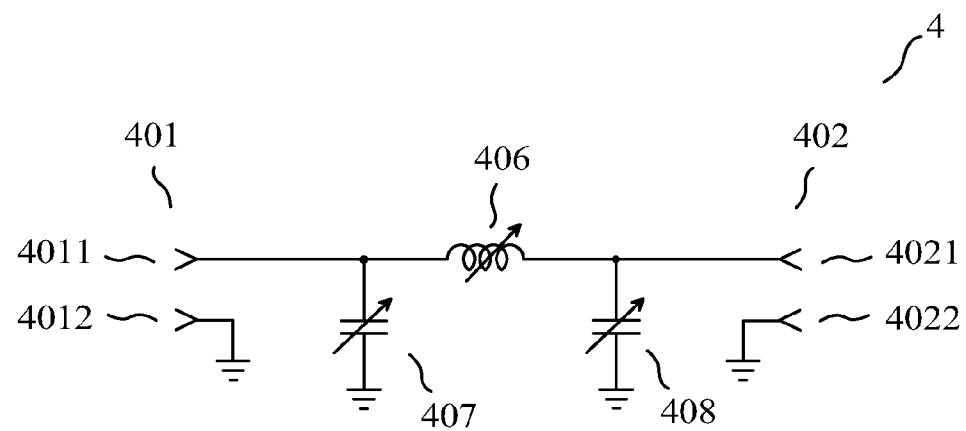
FIG. 9 shows a schematic diagram of a single-input-port and single-output-port tuning unit, which may be used in the apparatus for radio communication shown in FIG. 3 (sixth embodiment)

We have represented in FIG. 9 the single-input-port and single-output-port tuning unit (4) used in this sixth embodiment. This single-input-port and single-output-port tuning unit comprises:

an output port (401) having two terminals (4011) (4012), the output port being single-ended;

an input port (402) having two terminals (4021) (4022), the input port being single-ended;
one of the one or more adjustable impedance devices of the tuning unit (406), presenting a positive reactance, having a first terminal connected to a terminal of the input port, and having a second terminal connected to a terminal of the output port;
one of the one or more adjustable impedance devices of the tuning unit (407), presenting a negative reactance and connected in parallel with the output port; and
one of the one or more adjustable impedance devices of the tuning unit (408), presenting a negative reactance and connected in parallel with the input port.

Each of the one or more adjustable impedance devices of the tuning unit (406) (407) (408) is adjustable by electrical means, but the circuits and the control links needed to determine the reactance of each of the one or more adjustable impedance devices of the tuning unit are not shown in FIG. 9. In this sixth embodiment, we use p=3 adjustable impedance devices of the tuning unit.

The specialist understands that, at a frequency at which the single-input-port and single-output-port tuning unit is intended to operate, the single-input-port and single-output-port tuning unit is such that, if the impedance seen by the output port is equal to a given impedance, then the reactance of any one of the one or more adjustable impedance devices of the tuning unit has an effect on an impedance presented by the input port.

A flowchart of the process "delivering tuning control signals to the tuning unit" (84) is shown in FIG. 6. In addition to the begin symbol (841) and the end symbol (844), this flowchart comprises:
a process "generating initial values of the tuning control signals" (842), in which the transmission and signal processing unit delivers initial tuning unit adjustment instructions, and in which, for each of the one or more tuning control signals, the control unit generates a value of said each of the one or more tuning control signals, said value being referred to as initial value, said initial value being determined as a function of one or more of the initial tuning unit adjustment instructions, and only as a function of one or more of the initial tuning unit adjustment instructions; and
a process "generating subsequent values of the tuning control signals" (843), in which the transmission and signal processing unit delivers subsequent tuning unit adjustment instructions, and in which, for each of the one or more tuning control signals, the control unit generates values of said each of the one or more tuning control signals, said values being referred to as subsequent values, each of said subsequent values being determined as a function of one or more of the subsequent tuning unit adjustment instructions.

The one or more tuning control signals have no effect on the impedance seen by the output port, and consequently on said q real quantities depending on an impedance seen by the output port. The process "generating initial values of the tuning control signals" (842) only utilizes a quantity depending on the carrier frequency of the excitation and at least two of said q real quantities depending on an impedance seen by the output port, to obtain, for each of the one or more tuning control signals, an initial value. This process utilizing no measurement of a controlled variable, it is clear that it is an open-loop control scheme. In this process, the quantity depending on the carrier frequency of the excitation is a number proportional to the selected frequency. In this process, the transmission and signal processing unit uses a lookup table to determine and deliver the initial tuning unit adjustment instructions, as a function of the selected frequency and as a function of the at least two of said q real quantities depending on an impedance seen by the output port. The specialist knows how to build and use such a lookup table.

According to a first example of the process "generating initial values of the tuning control signals" (842), the lookup table may be stored in a read-only memory, and it may have been built using data obtained by determining, in a laboratory with a prototype of the apparatus for radio communication, at different frequencies and for different configurations producing different values of the impedance seen by the output port, initial tuning unit adjustment instructions producing the highest possible values of a transducer power gain of the single-input-port and single-output-port tuning unit. This process requires no difficult computation, and it quickly provides initial tuning unit adjustment instructions, which are such that a resulting transducer power gain of the single-input-port and single-output-port tuning unit is not very far from a maximum transducer power gain achievable with the single-input-port and single-output-port tuning unit at the carrier frequency of the excitation, because the at least two of said q real quantities depending on an impedance seen by the output port fully determine the impedance seen by the output port, at the carrier frequency of the excitation, after the end of the process "delivering antenna control signals to the tunable passive antenna" (82).

According to a second example of the process "generating initial values of the tuning control signals" (842), the lookup table may be stored in a read-only memory, and it may have been built using data obtained by determining, in a laboratory with a prototype of the apparatus for radio communication, at different frequencies and for different configurations producing different values of the impedance seen by the output port, initial tuning unit adjustment instructions producing the smallest possible values of an absolute value of the difference between the impedance presented by the input port and a wanted impedance. This process requires no difficult computation, and it quickly provides initial tuning unit adjustment instructions which are such that, at the carrier frequency of the excitation, the impedance presented by the input port is not very far from the wanted impedance, because the at least two of said q real quantities depending on an impedance seen by the output port fully determine the impedance seen by the output port, at the carrier frequency of the excitation, after the end of the process "delivering antenna control signals to the tunable passive antenna" (82).

Unfortunately, the process "generating initial values of the tuning control signals" (842) cannot be very accurate, for the reasons already mentioned above, in the presentation of the fourth embodiment.

The process "generating subsequent values of the tuning control signals" (843) is used to substantially maximize an average power delivered by the output port, at the carrier frequency of the excitation. This process is accurate, because it uses an extremum-seeking control algorithm. This process quickly provides one or more subsequent tuning unit adjustment instructions such that this average power delivered by the output port takes on a value which is very near a maximum value, because this process is started not very far from this maximum value, thanks to a process "generating initial values of the tuning control signals" (842) which takes into account the result of the process "delivering antenna control signals to the tunable passive antenna" (82). In the previous sentence, "maximum value" means the greatest value, of said average power, which may be achieved by only adjusting the single-input-port and single-output-port tuning unit.

Since it uses assumed characteristics of the single-input-port and single-output-port tuning unit, the process "generating initial values of the tuning control signals" (842) is model-based. In contrast, the process "generating subsequent values of the tuning control signals" (843) is non-model-based, and it uses a closed-loop control scheme.

The process "generating initial values of the tuning control signals" (842) and the process "generating subsequent values of the tuning control signals" (843) are such that the adjustment of the single-input-port and single-output-port tuning unit is always optimal or almost optimal, in spite of the presence of losses in the single-input-port and single-output-port tuning unit. Consequently, this embodiment is a solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small. Moreover, this embodiment provides a much broader tuning range than an automatic tuning system which would comprise the single-input-port and single-output-port tuning unit shown in FIG. 9, but no tunable passive antenna.

Seventh Embodiment

The seventh embodiment of a device of the invention, given by way of non-limiting example, also corresponds to the apparatus for radio communication shown in FIG. 3, and all explanations provided for the first embodiment are applicable to this seventh embodiment. In this seventh embodiment, the excitation is applied continuously, so that the sensing unit can continuously deliver two sensing unit output signals determined by electrical variables sensed at the output port while the excitation is applied to the input port. A flowchart of one of the one or more adjustment sequences used in this seventh embodiment is shown in FIG. 8. Before the beginning of said one of the one or more adjustment sequences, a "selected frequency" has been chosen by the transmission and signal processing unit, among the elements of the set of possible values of the carrier frequency of the excitation. Said excitation has, during said one of the one or more adjustment sequences, a carrier frequency which is equal to the selected frequency. In addition to the begin symbol (81) and the end symbol (86), said flowchart comprises:

a process "delivering antenna control signals to the tunable passive antenna" (82), in which the transmission and signal processing unit delivers one or more of the one or more antenna adjustment instructions, and in which the control unit delivers said one or more antenna control signals to the tunable passive antenna, each of said one or more of the one or more antenna adjustment instructions being determined as a function of one or more of said q real quantities depending on an impedance seen by the output port; and a process "delivering tuning control signals to the tuning unit" (84), in which the transmission and signal processing unit delivers one or more of the tuning unit adjustment instructions, and in which the control unit delivers said one or more tuning control signals to the single-input-port and single-output-port tuning unit.

In this seventh embodiment, the one or more antenna adjustment instructions and the one or more antenna control signals are such that:

at the end of the process "delivering antenna control signals to the tunable passive antenna" (82), the impedance seen by the output port approximates a specified impedance, which may depend on frequency; and each said at least one parameter of each said at least one antenna control device of the tunable passive antenna has a value which does not change from the end of the process "delivering antenna control signals to the tunable passive antenna" (82) to the beginning of an adjustment sequence which follows the end of said one of the one or more adjustment sequences.

To obtain that, at the end of the process "delivering antenna control signals to the tunable passive antenna" (82), the impedance seen by the output port approximates the specified impedance, the transmission and signal processing unit estimates the q real quantities depending on an impedance seen by the output port, and uses a lookup table to determine and deliver the one or more antenna adjustment instructions, as a function of the selected frequency and of the q real quantities depending on an impedance seen by the output port, and as a function of the one or more antenna adjustment instructions which were applicable while the sensing unit delivered the sensing unit output signals used to estimate the q real quantities depending on an impedance seen by the output port. The specialist understands how to build and use such a lookup table. The lookup table is such that the adjustment of the tunable passive antenna is optimal or nearly optimal. The specialist understands that such a lookup table takes into account the variations of $Z_{Sant}$ caused by variations in the electromagnetic characteristics of the volume surrounding the tunable passive antenna. Consequently, the resulting accuracy may be better than the one obtained in the corresponding process of the sixth embodiment. However, as said above in the prior art section, tunable passive antennas often only provide a poor tuning capability. Consequently, at the end of the process "delivering antenna control signals to the tunable passive antenna" (82), the impedance seen by the output port typically only very coarsely approximates the specified impedance.

Eighth Embodiment

The eighth embodiment of a device of the invention, given by way of non-limiting example, also corresponds to the apparatus for radio communication shown in FIG. 3, and all explanations provided for the first embodiment are applicable to this eighth embodiment.

Figure 10:
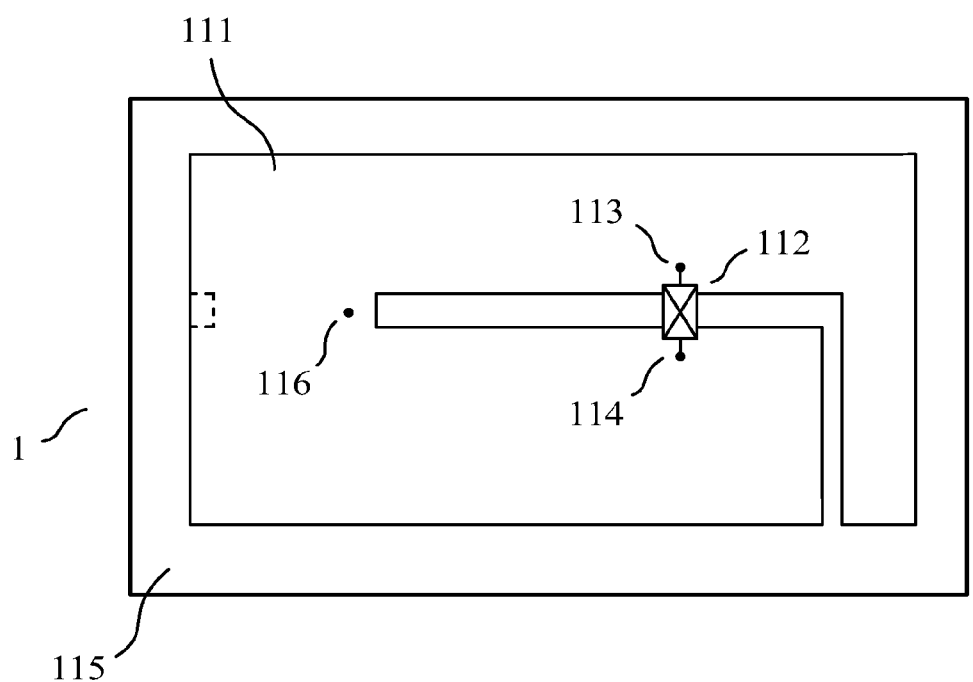
FIG. 10 shows a first tunable passive antenna, which comprises a single antenna control device (eighth embodiment)

The tunable passive antenna (1) used in this eighth embodiment is shown in FIG. 10. The tunable passive antenna shown in FIG. 10 comprises a planar metallic structure (111) built above a ground plane (115), the signal port of the tunable passive antenna (116) where an unbalanced feeder is connected to the metallic structure, and an antenna control device (112). The metallic structure is slotted and such that, if the antenna control device was not present, the tunable passive antenna would be an example of a planar inverted-F antenna, also referred to as PIFA. The antenna control device is a MEMS switch comprising a first terminal (113) connected to the metallic structure (111) at a first side of the slot, and a second terminal (114) connected to the metallic structure (111) at a second side of the slot. The specialist understands that the self-impedance of the tunable passive antenna, in a given test configuration and at the given frequency, is a characteristic of the tunable passive antenna which may be varied using said antenna control device, so that this characteristic is controlled by utilizing said antenna control device. The state of the MEMS switch (on or off) is a parameter of the antenna control device which has an influence on said characteristic. This parameter of the antenna control device is adjustable by electrical means, but the circuits and the control links needed to determine the state of the antenna control device are not shown in FIG. 10.

Ninth Embodiment

The ninth embodiment of an apparatus of the invention, given by way of non-limiting example, also corresponds to the apparatus for radio communication shown in FIG. 3, and all explanations provided for the first embodiment are applicable to this ninth embodiment.

Figure 11:
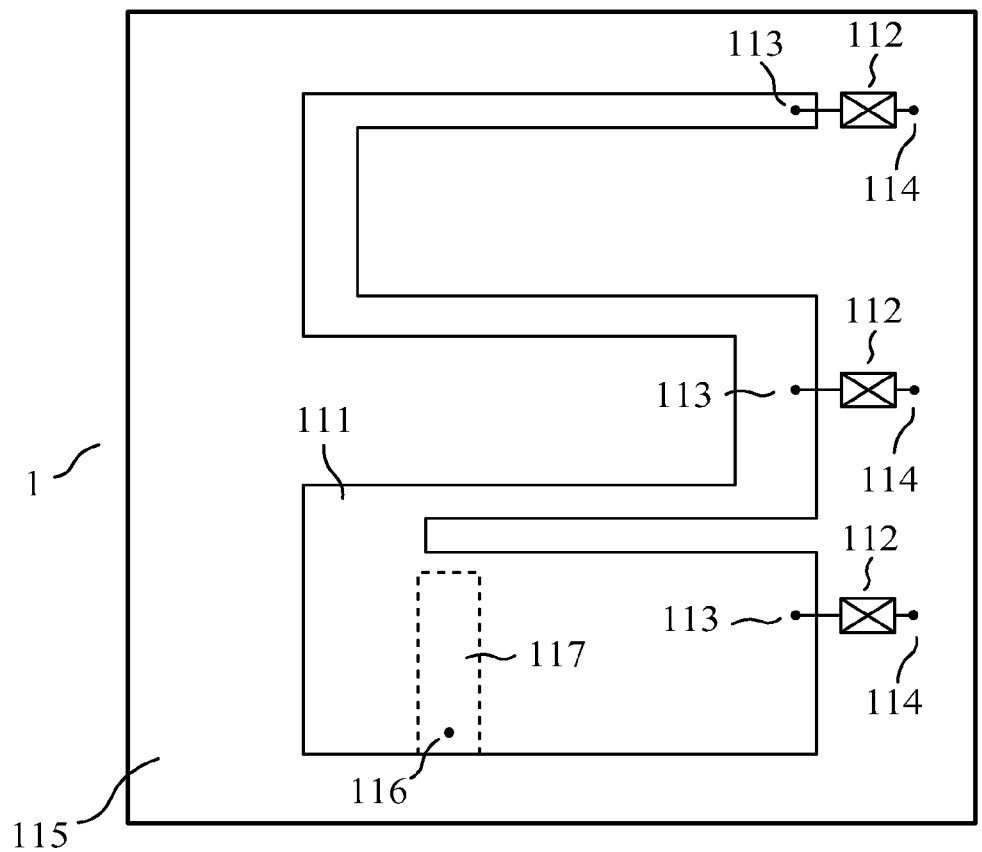
FIG. 11 shows a second tunable passive antenna, which comprises three antenna control devices (ninth embodiment)

The tunable passive antenna (1) used in this ninth embodiment is shown in FIG. 11. The tunable passive antenna shown in FIG. 11 comprises a planar metallic structure (111) built above a ground plane (115), the signal port of the tunable passive antenna (116) where an unbalanced feeder is connected to a metallic strip (117) lying between the ground plane and the metallic structure, and three antenna control devices (112). Each of the antenna control devices is an adjustable impedance device having a reactance at the given frequency, comprising a first terminal (113) connected to the metallic structure (111), and a second terminal (114) connected to the ground plane (115). The specialist understands that the self-impedance of the tunable passive antenna, in a given test configuration and at the given frequency, is a characteristic of the tunable passive antenna which may be varied using said antenna control devices, so that this characteristic is controlled by utilizing said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 11.

Tenth Embodiment

The tenth embodiment of an apparatus of the invention, given by way of non-limiting example, also corresponds to the apparatus for radio communication shown in FIG. 3, and all explanations provided for the first embodiment are applicable to this tenth embodiment.

Figure 12:
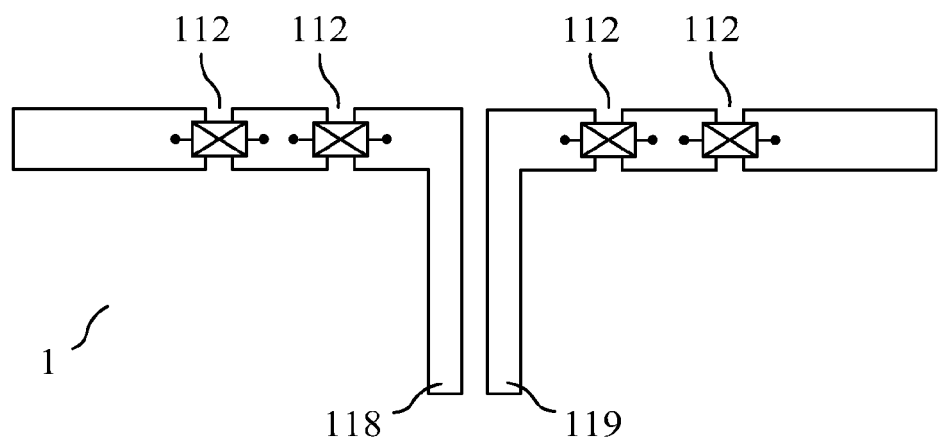
FIG. 12 shows a third tunable passive antenna, which comprises four antenna control devices (tenth embodiment)

The tunable passive antenna (1) used in this tenth embodiment is shown in FIG. 12. The tunable passive antenna shown in FIG. 12 has a plane of symmetry orthogonal to the drawing. Thus, the tunable passive antenna has a first half-antenna, on the left in FIG. 12, and a second half-antenna, on the right in FIG. 12. The signal port of the tunable passive antenna comprises a first terminal (118) where a first conductor of a balanced feeder is connected to the first half-antenna, and a second terminal (119) where a second conductor of the balanced feeder is connected to the second half-antenna. Each half-antenna includes three segments and two antenna control devices (112). Each of the antenna control devices is an adjustable impedance device having a reactance at the given frequency, comprising a first terminal connected to a segment of an half-antenna, and a second terminal connected to another segment of this half-antenna. The specialist understands that the self-impedance of the tunable passive antenna, in a given test configuration and at the given frequency, is a characteristic of the tunable passive antenna which may be varied using said antenna control devices, so that this characteristic is controlled by utilizing said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 12.

Eleventh Embodiment

The eleventh embodiment of an apparatus of the invention, given by way of non-limiting example, also corresponds to the apparatus for radio communication shown in FIG. 3, and all explanations provided for the first embodiment are applicable to this eleventh embodiment.

Figure 13:
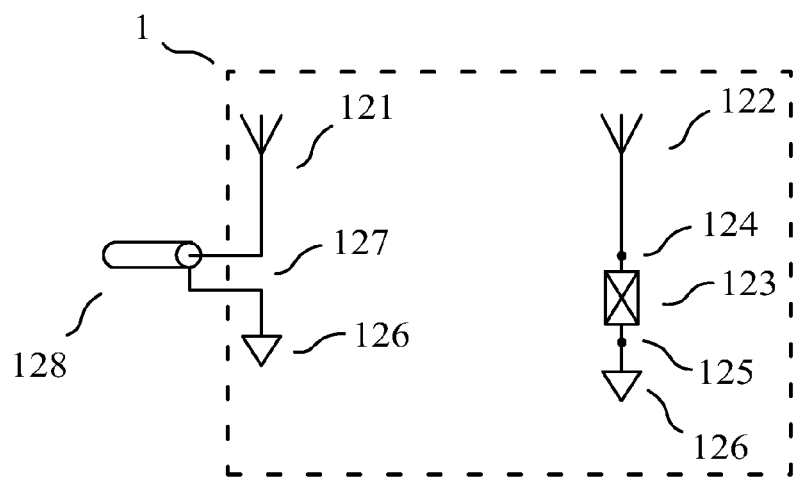
FIG. 13 shows a fourth tunable passive antenna, which comprises a single antenna control device (eleventh embodiment)

The tunable passive antenna (1) used in this eleventh embodiment is shown in FIG. 13. The tunable passive antenna shown in FIG. 13 comprises a main antenna (121), a parasitic antenna (122), the signal port of the tunable passive antenna (127) where an unbalanced feeder (128) is connected to the main antenna and to ground (126), and an antenna control device (123). The antenna control device is an adjustable impedance device having a reactance at the given frequency, comprising a first terminal (124) connected to the parasitic antenna (122), and a second terminal (125) connected to ground (126). The specialist understands that the directivity pattern of the tunable passive antenna, in a given test configuration and at the given frequency, is a characteristic of the tunable passive antenna which may be varied using said antenna control device, so that this characteristic is controlled by utilizing said antenna control device. The reactance of the antenna control device at the given frequency is a parameter of said antenna control device which has an influence on said characteristic. This parameter of the antenna control device is adjustable by electrical means, but the circuits and the control links needed to determine the reactance of the antenna control device are not shown in FIG. 13.

However, the specialist understands that this parameter also has an influence on the self-impedance of the tunable passive antenna, so that the self-impedance of the tunable passive antenna, in a given test configuration and at the given frequency, is also a characteristic of the tunable passive antenna which may be varied using said antenna control device. The tunable passive antenna (1) could also comprise other parasitic antennas each coupled to an antenna control device.

Twelfth Embodiment

As a twelfth embodiment of the invention, given by way of non-limiting example, we consider a method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

estimating one or more "localization variables", each of the one or more localization variables depending on a distance between a part of a human body and a zone of the apparatus for radio communication;

delivering one or more "antenna control signals", as a function of a "selected frequency" and as a function of the one or more localization variables, each of the one or more tunable passive antennas comprising at least one antenna control device, said at least one antenna control device having at least one parameter having an effect on one or more characteristics of said each of the one or more tunable passive antennas, said at least one parameter being adjustable by electrical means, said at least one parameter being mainly determined by at least one of the one or more antenna control signals;

applying an excitation to the input port, the excitation having a carrier frequency referred to as "the carrier frequency of the excitation" and equal to the selected frequency;

sensing one or more electrical variables at the output port while the excitation is applied, to obtain one or more "sensing unit output signals", each of the one or more sensing unit output signals being mainly determined by at least one of the one or more electrical variables sensed at the output port;

estimating q real quantities depending on an impedance seen by the output port, where q is an integer greater than or equal to one, by utilizing one or more of the one or more sensing unit output signals; and delivering one or more "tuning control signals", the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals, the reactance of any one of the one or more adjustable impedance devices of the tuning unit having an influence on an impedance presented by the input port, the step of delivering one or more tuning control signals comprising the following steps:

generating, for each of the one or more tuning control signals, an initial value of said each of the one or more tuning control signals, as a function of the selected frequency (or, equivalently, of the carrier frequency of the excitation) and as a function of said q real quantities depending on an impedance seen by the output port; and generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

Figure 14:
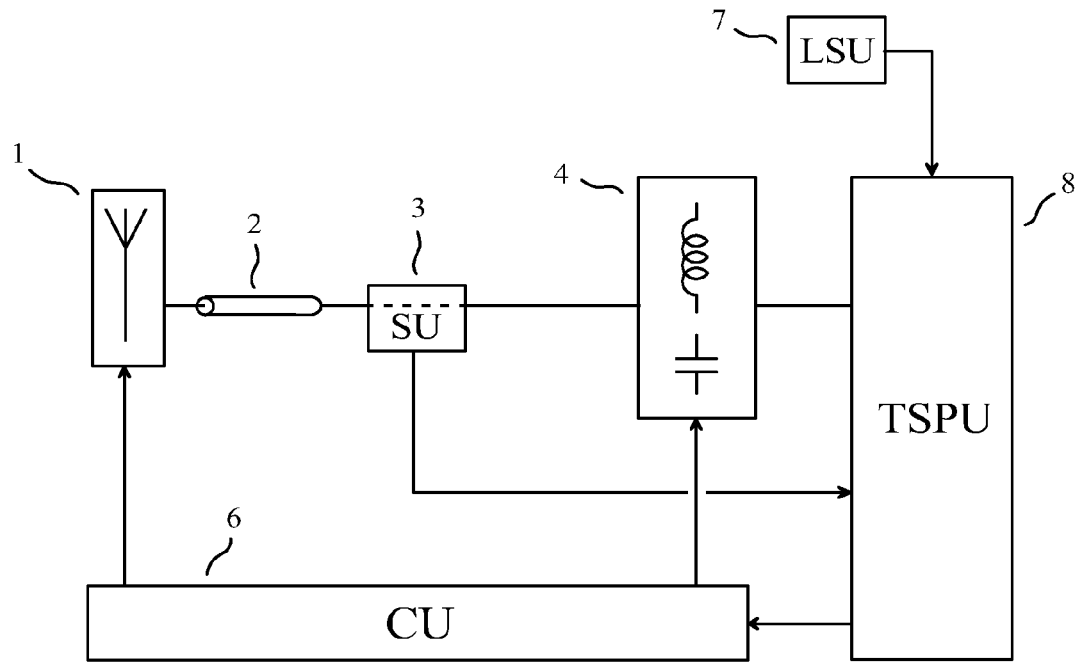
FIG. 14 shows a block diagram of an apparatus for radio communication of the invention (twelfth embodiment)

We have represented in FIG. 14 the block diagram of an apparatus for radio communication implementing this method, the apparatus for radio communication comprising:

a localization sensor unit (7), the localization sensor unit estimating one or more "localization variables", each of the one or more localization variables depending on a distance between a part of a human body and a zone of the apparatus for radio communication;

a tunable passive antenna (1), the tunable passive antenna comprising at least one antenna control device, said at least one antenna control device having at least one parameter having an effect on one or more characteristics of the tunable passive antenna, said at least one parameter being adjustable by electrical means;

a feeder (2);

a single-input-port and single-output-port tuning unit (4) similar to the one used in the first embodiment, having an input port and an output port;

a sensing unit (3) delivering two "sensing unit output signals", each of the sensing unit output signals being mainly determined by one or more electrical variables sensed at the output port while an excitation is applied to the input port;

a transmission and signal processing unit (8), the transmission and signal processing unit delivering one or more "antenna adjustment instructions", each of the one or more antenna adjustment instructions being determined as a function of a "selected frequency" and as a function of the one or more localization variables, the selected frequency being greater than or equal to 300 MHz, the transmission and signal processing unit applying the excitation to the input port, the excitation having a carrier frequency referred to as "the carrier frequency of the excitation" and equal to the selected frequency, the transmission and signal processing unit estimating q real quantities depending on an impedance seen by the output port, where q is an integer greater than or equal to one, by utilizing one or more of the sensing unit output signals, the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of the selected frequency (or, equivalently, of the carrier frequency of the excitation) and as a function of said q real quantities depending on an impedance seen by the output port, at least one of the tuning unit adjustment instructions being a "subsequent tuning unit adjustment instruction", the transmission and signal processing unit performing an extremum-seeking control algorithm to generate each of the one or more subsequent tuning unit adjustment instructions, the extremum-seeking control algorithm seeking to maximize a performance variable, the performance variable being estimated as a function of one or more of the sensing unit output signals; and a control unit (6) similar to the one used in the first embodiment, the control unit delivering one or more "antenna control signals" to the tunable passive antenna, the control unit delivering one or more "tuning control signals" to the single-input-port and single-output-port tuning unit.

It is possible that at least one of the one or more localization variables is an output of a sensor responsive to a pressure exerted by a part of a human body. Thus, it is possible that at least one of the one or more localization variables is the output of a circuit comprising a switch using a single pressure non-locking mechanical system, the state of which changes while a sufficient pressure is exerted by a part of a human body. It is also possible that at least one of the one or more localization variables is the output of a circuit comprising another type of electromechanical sensor responsive to a pressure exerted by a part of a human body, for instance a microelectromechanical sensor (MEMS sensor).

It is possible that at least one of the one or more localization variables is an output of a proximity sensor, such as a proximity sensor dedicated to the detection of a human body. Such a proximity sensor may for instance be a capacitive proximity sensor, or an infrared proximity sensor using reflected light intensity measurements, or an infrared proximity sensor using time-of-flight measurements, which are well known to specialists.

It is possible that the set of the possible values of at least one of the one or more localization variables is a finite set. It is possible that at least one of the one or more localization variables is a binary variable, that is to say such that the set of the possible values of said at least one of the one or more localization variables has exactly two elements. For instance, a capacitive proximity sensor dedicated to the detection of a human body (for instance the device SX9300 of Semtech) can be used to obtain a binary variable, which indicates whether or not a human body has been detected near a zone of the apparatus for radio communication. It is possible that the set of the possible values of any one of the one or more localization variables is a finite set. However, it is possible that the set of the possible values of at least one of the one or more localization variables is an infinite set, and it is possible that the set of the possible values of at least one of the one or more localization variables is a continuous set.

It is possible that the set of the possible values of at least one of the one or more localization variables has at least three elements. For instance, an infrared proximity sensor using time-of-flight measurements and dedicated to the assessment of the distance to a human body (for instance the device VL6180 of STMicroelectronics) can be used to obtain a localization variable such that the set of the possible values of the localization variable has three or more elements, one of the values meaning that no human body has been detected, each of the other values corresponding to a different distance between a zone of the apparatus for radio communication and the nearest detected part of a human body. It is possible that the set of the possible values of any one of the one or more localization variables has at least three elements.

It is possible that at least one of the one or more localization variables is an output of a sensor which is not dedicated to human detection. For instance, it is possible that at least one of the one or more localization variables is determined by a change of state of a switch of a keypad or keyboard, which is indicative of the position of a human finger. For instance, it is possible that at least one of the one or more localization variables is determined by a change of state of an output of a touchscreen, which is indicative of the position of a human finger. Such a touchscreen may use any one of the available technologies, such as a resistive touchscreen, a capacitive touchscreen or a surface acoustic wave touchscreen, etc.

It is said above that each of the one or more localization variables depends on the distance between a part of a human body and a zone of the apparatus for radio communication. This must be interpreted as meaning: each of the one or more localization variables is such that there exists at least one configuration in which the distance between a part of a human body and a zone of the apparatus for radio communication has an effect on said each of the one or more localization variables. However, it is possible that there exist one or more configurations in which the distance between a part of a human body and a zone of the apparatus for radio communication has no effect on said each of the one or more localization variables. For instance, the distance between a part of a human body and a zone of the apparatus for radio communication has no effect on a switch, in a configuration in which no force is directly or indirectly exerted by the human body on the switch. For instance, the distance between a part of a human body and a zone of the apparatus for radio communication has no effect on a proximity sensor if the human body is out of the proximity sensor's range.

The selected frequency may take on any value in a "set of possible values of the carrier frequency of the excitation", which comprises several elements. Each of the one or more antenna adjustment instructions being determined as a function of the selected frequency and of the one or more localization variables, and only as a function of the selected frequency and of the one or more localization variables, it is clear that open-loop control is utilized to generate each of the one or more antenna control signals.

The specialist understands that, in this twelfth embodiment, the step of delivering one or more antenna control signals can be more accurate than the corresponding step of the fourth embodiment and of the sixth embodiment, thanks to the use of the one or more localization variables.

Thirteenth Embodiment

The thirteenth embodiment of a device of the invention, given by way of non-limiting example, also corresponds to the apparatus for radio communication shown in FIG. 14, and all explanations provided for the twelfth embodiment are applicable to this thirteenth embodiment. Moreover, in this thirteenth embodiment, the apparatus for radio communication is a mobile phone, and the localization sensor unit comprises 4 proximity sensors.

Figure 15:
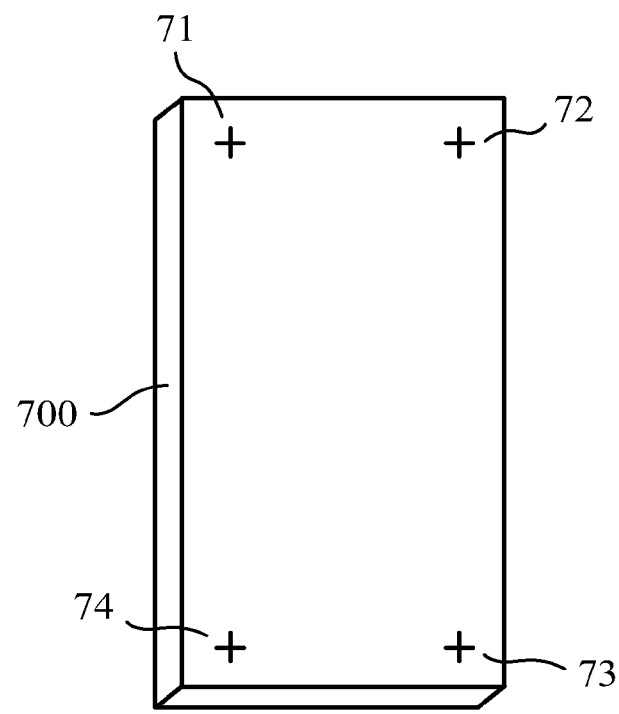
FIG. 15 shows a back view of a mobile phone (thirteenth embodiment)

FIG. 15 is a drawing of a back view of the mobile phone (700). FIG. 15 shows: a point (71) where the first of the 4 proximity sensors is located; a point (72) where the second of the 4 proximity sensors is located; a point (73) where the third of the 4 proximity sensors is located; and a point (74) where the fourth of the 4 proximity sensors is located.

Figure 16:
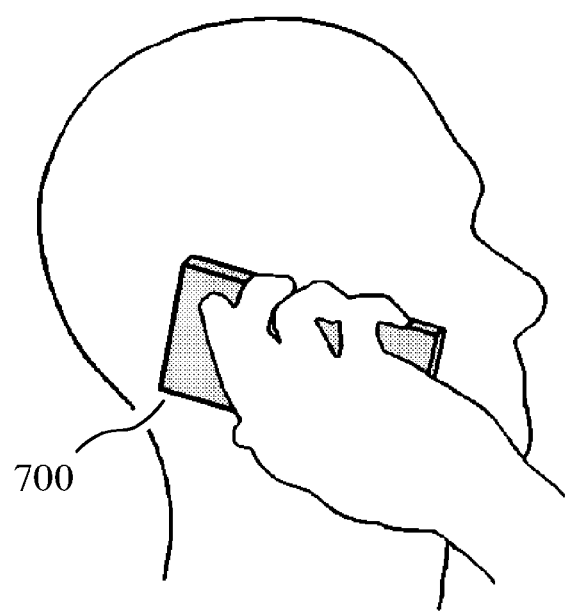
FIG. 16 shows a first typical use configuration (right hand and head configuration)
Figure 17:
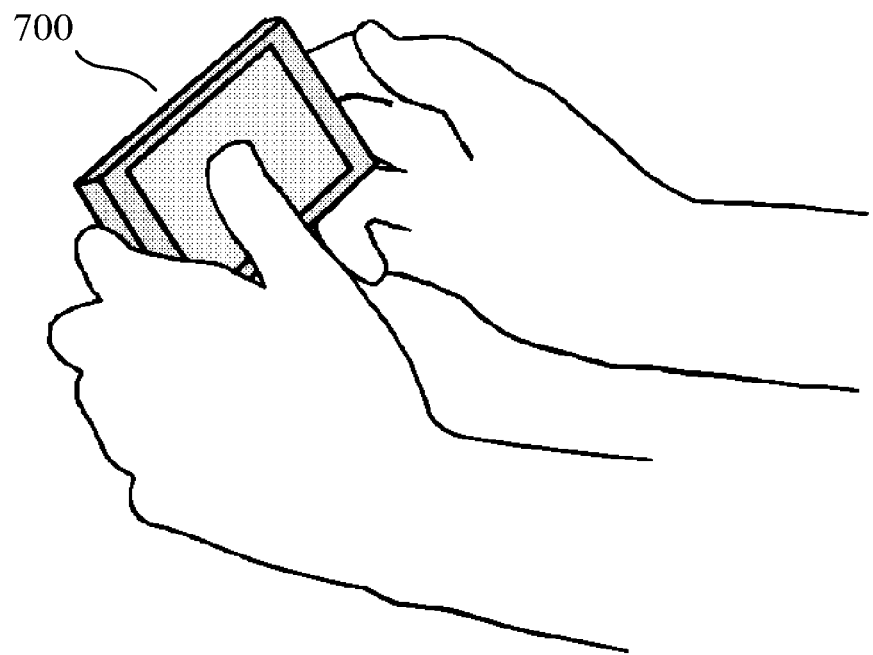
FIG. 17 shows a second typical use configuration (two hands configuration)
Figure 18:
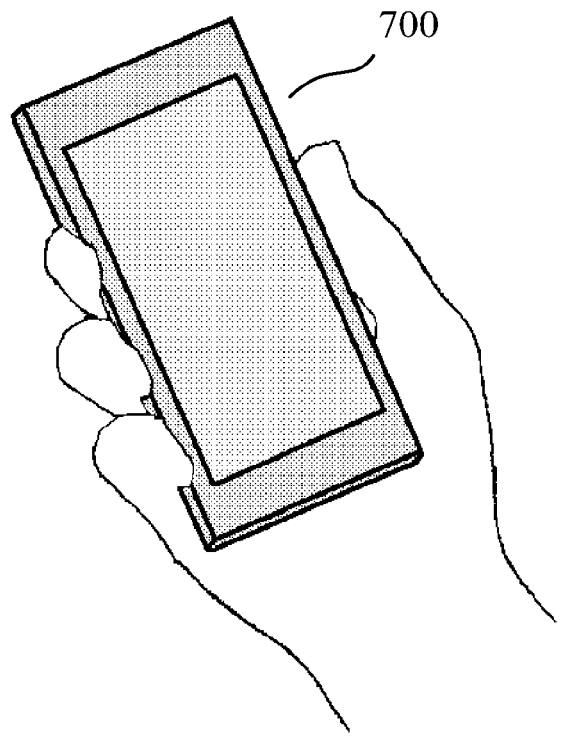
FIG. 18 shows a third typical use configuration (right hand only configuration)

A finite set of typical use configurations is defined. For instance, FIG. 16 shows a first typical use configuration, which may be referred to as the "right hand and head configuration"; FIG. 17 shows a second typical use configuration, which may be referred to as the "two hands configuration"; and FIG. 18 shows a third typical use configuration, which may be referred to as the "right hand only configuration". In FIG. 16, FIG. 17 and FIG. 18, the mobile phone (700) is held by a user. More precisely, the user holds the mobile phone close to his head using his right hand in FIG. 16; the user holds the mobile phone far from his head using both hands in FIG. 17; and the user holds the mobile phone far from his head using his right hand only in FIG. 18. In an actual use configuration, the localization variables assessed by the 4 proximity sensors are used to determine the typical use configuration which is the closest to the actual use configuration. Each of the one or more antenna adjustment instructions is determined from a set of pre-defined antenna adjustment instructions that are stored in a lookup table realized in the transmission and signal processing unit, based on the closest typical use configuration and on the selected frequency. The specialist understands how to build and use such a lookup table. The specialist understands the advantage of defining and using a set of typical use configurations, which must be sufficiently large to cover all relevant cases, and sufficiently small to avoid an excessively large lookup table.

It has been shown that, to obtain a good accuracy of each of the one or more antenna adjustment instructions, more than two typical use configurations must be defined, and a single localization variable cannot be used to determine a closest typical use configuration. Consequently, in this thirteenth embodiment, it is important that a plurality of localization variables is estimated.

Additionally, to be able to determine a closest typical use configuration, it is necessary to use localization variables depending on the distance between a part of a human body and different zones of the apparatus for radio communication. More precisely, it is necessary that there exist two of the localization variables, denoted by A and B, the localization variable A depending on the distance between a part of a human body and a zone X of the apparatus for radio communication, the localization variable B depending on the distance between a part of a human body and a zone Y of the apparatus for radio communication, such that X or Y are distinct, or preferably such that X and Y have an empty intersection. In this thirteenth embodiment, this result is obtained by utilizing a localization sensor unit comprising a plurality of proximity sensors, located at different places in the apparatus for radio communication, as shown in FIG. 15.

Fourteenth Embodiment

The fourteenth embodiment of a device of the invention, given by way of non-limiting example, also corresponds to the apparatus for radio communication shown in FIG. 3, to the flowcharts shown in FIG. 4 and in FIG. 6, and to the single-input-port and single-output-port tuning unit shown in FIG. 5. All explanations provided for the first embodiment and for the fourth embodiment are applicable to this fourteenth embodiment. Since p=2, the one or more adjustable impedance devices of the tuning unit may be referred to as "the adjustable impedance devices of the tuning unit".

In this fourteenth embodiment, the control unit delivers two tuning control signals to the single-input-port and single-output-port tuning unit, and the reactance of each of the adjustable impedance devices of the tuning unit is mainly determined by one and only one of the tuning control signals.

Figure 19:
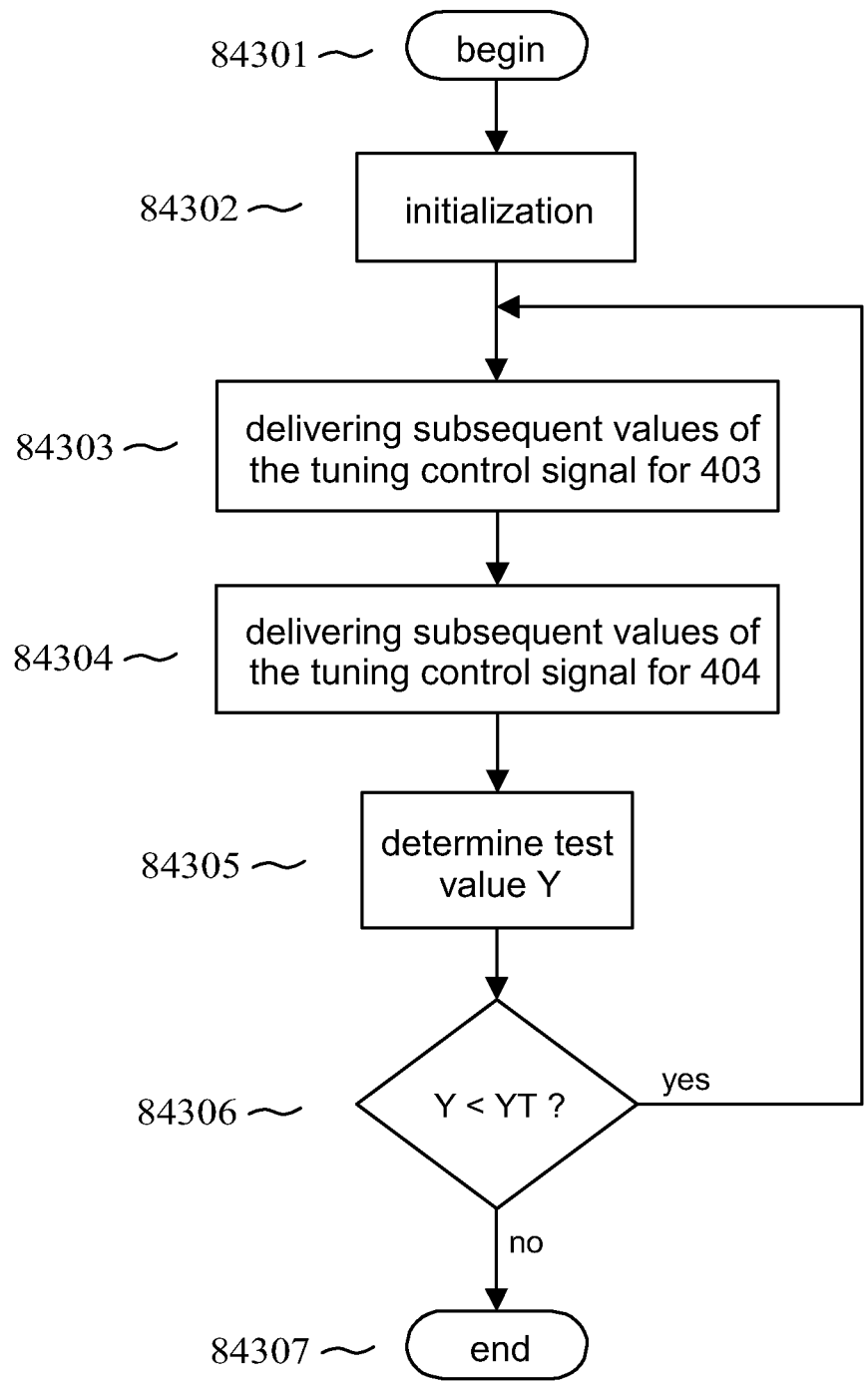
FIG. 19 shows a flowchart implemented in an apparatus for radio communication of the invention (fourteenth embodiment)

We have represented in FIG. 19 a flowchart applicable, in this fourteenth embodiment, to the process "generating subsequent values of the tuning control signals" (843) of FIG. 6. In addition to the begin symbol (84301) and the end symbol (84307), this flowchart comprises:
 a process "initialization" (84302), in which a requirement is defined;
 a process "delivering subsequent values of the tuning control signal for 403" (84303), in which at least one subsequent value of the tuning control signal which mainly determines the reactance of a first one of the adjustable impedance devices of the tuning unit (403) is delivered using a single-parameter extremum-seeking control algorithm, the single-parameter extremum-seeking control algorithm seeking to maximize the performance variable by controlling said tuning control signal which mainly determines the reactance of a first one of the adjustable impedance devices of the tuning unit (403);
 a process "delivering subsequent values of the tuning control signal for 404" (84304), in which at least one subsequent value of the tuning control signal which mainly determines the reactance of a second one of the adjustable impedance devices of the tuning unit (404) is delivered using a single-parameter extremum-seeking control algorithm, the single-parameter extremum-seeking control algorithm seeking to maximize the performance variable by controlling said tuning control signal which mainly determines the reactance of a second one of the adjustable impedance devices of the tuning unit (404);
 a process (84305) in which a test value is determined; and
 a decision (84306) used to reach the end symbol (84307) if the test value satisfies the requirement (which corresponds to a termination criterion).

The specialist understands that, in this fourteenth embodiment, at least one subsequent value of each of the tuning control signals is generated using a 2-parameter extremum-seeking control algorithm, the 2-parameter extremum-seeking control algorithm using a single-parameter extremum-seeking control algorithm in the process "delivering subsequent values of the tuning control signal for 403" (84303), and a single-parameter extremum-seeking control algorithm in the process "delivering subsequent values of the tuning control signal for 404" (84304). Here, "single-parameter extremum-seeking control algorithm" refers to an extremum-seeking control algorithm which controls and varies 1 tuning control signal over time, and "2-parameter extremum-seeking control algorithm" refers to an extremum-seeking control algorithm which controls and varies 2 tuning control signals over time.

More generally, if p is an integer greater than or equal to 2, let "p-parameter extremum-seeking control algorithm" refer to an extremum-seeking control algorithm which controls and varies p tuning control signals over time. In a different embodiment such that the single-input-port and single-output-port tuning unit has p adjustable impedance devices of the tuning unit, such that the control unit delivers p tuning control signals, and such that the reactance of each of the adjustable impedance devices of the tuning unit is mainly determined by one and only one of the tuning control signals, it is possible that at least one subsequent value of each of the tuning control signals is generated using a p-parameter extremum-seeking control algorithm, which uses a plurality of extremum-seeking control algorithms each of which controls and varies less than p tuning control signals over time, for instance p single-parameter extremum-seeking control algorithms.

Fifteenth Embodiment

The fifteenth embodiment of a device of the invention, given by way of non-limiting example, also corresponds to the apparatus for radio communication shown in FIG. 3, to the flowcharts shown in FIG. 4 and in FIG. 6, to the single-input-port and single-output-port tuning unit shown in FIG. 5, and to the flowchart of the process "generating subsequent values of the tuning control signals" shown in FIG. 19. All explanations provided for the first embodiment, the fourth embodiment and the fourteenth embodiment are applicable to this fifteenth embodiment.

We have represented in FIG. 20 a flowchart which is applicable, in this fifteenth embodiment, to the process "delivering subsequent values of the tuning control signal for 403" (84303) of FIG. 19, and to the process "delivering subsequent values of the tuning control signal for 404" (84304) of FIG. 19. In addition to the begin symbol (84901) and the end symbol (84906), this flowchart comprises:

- a process (84902) in which a timer is set to zero and started;
- a process (84903) in which a single-parameter extremum-seeking control algorithm, which delivers subsequent values of one of the tuning control signals, is started;
- a decision (84904) used to wait for a predefined period; and
- a process (84905) in which the single-parameter extremum-seeking control algorithm is stopped.

For instance, a suitable single-parameter extremum-seeking control algorithm may be a perturbation based extremum-seeking control algorithm, which comprises a step in which a periodical perturbation is applied to said one of the tuning control signals. For instance, this approach is discussed in chapter 1 of said book of K. B. Ariyur and M. Krstic, in the case of a purely analog implementation.

Sixteenth Embodiment

The sixteenth embodiment of a device of the invention, given by way of non-limiting example, also corresponds to the apparatus for radio communication shown in FIG. 3, to the flowcharts shown in FIG. 4 and in FIG. 6, to the single-input-port and single-output-port tuning unit shown in FIG. 5, and to the flowchart of the process "generating subsequent values of the tuning control signals" shown in FIG. 19. All explanations provided for the first embodiment, the fourth embodiment and the fourteenth embodiment are applicable to this sixteenth embodiment.

We have represented in FIG. 21 a flowchart which is applicable, in this sixteenth embodiment, to the process "delivering subsequent values of the tuning control signal for 403" (84303) of FIG. 19, and to the process "delivering subsequent values of the tuning control signal for 404" (84304) of FIG. 19. In addition to the begin symbol (84901) and the end symbol (84906), this flowchart comprises:

- a process (84907) in which a requirement is defined;
- a process (84908) in which one stage of a single-parameter extremum-seeking control algorithm is performed, during which a predefined number of subsequent values of one of the tuning control signals are delivered;
- a process (84909) in which a test value is determined; and
- a decision (84910) used to reach the end symbol (84906) if the test value satisfies the requirement.

For instance, a suitable single-parameter extremum-seeking control algorithm may be a stochastic extremum-seeking control algorithm, which comprises a step in which a stochastic or random perturbation, for instance a colored noise passed through a bounded nonlinearity, is applied to said one of the tuning control signals. For instance, this approach is discussed in chapter 5 of said book of S.-J. Liu and M. Krstic, in the case of a purely analog implementation.

Seventeenth Embodiment

The seventeenth embodiment of a device of the invention, given by way of non-limiting example, also corresponds to the apparatus for radio communication shown in FIG. 3, to the flowcharts shown in FIG. 4 and in FIG. 6, and to the single-input-port and single-output-port tuning unit shown in FIG. 5. All explanations provided for the first embodiment and for the fourth embodiment are applicable to this seventeenth embodiment. Since p=2, the one or more adjustable impedance devices of the tuning unit may be referred to as "the adjustable impedance devices of the tuning unit".

In this seventeenth embodiment, the control unit delivers two tuning control signals to the single-input-port and single-output-port tuning unit, and the reactance of each of the adjustable impedance devices of the tuning unit is mainly determined by one and only one of the tuning control signals.

Figure 22:
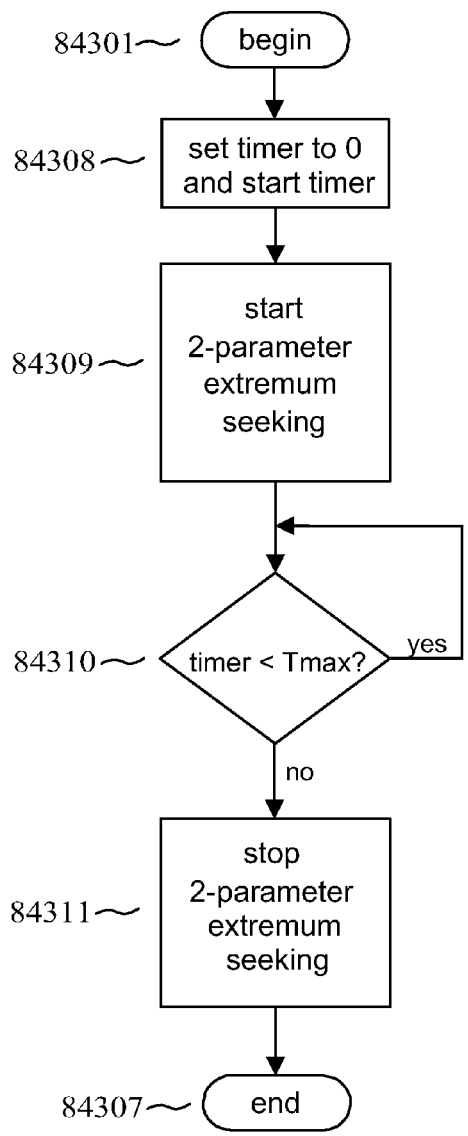
FIG. 22 shows a flowchart implemented in an apparatus for radio communication of the invention (seventeenth embodiment)

We have represented in FIG. 22 a flowchart applicable, in this seventeenth embodiment, to the process "generating subsequent values of the tuning control signals" (843) of FIG. 6. In addition to the begin symbol (84301) and the end symbol (84307), this flowchart comprises:

- a process (84308) in which a timer is set to zero and started;
- a process (84309) in which a 2-parameter extremum-seeking control algorithm, which delivers subsequent values of both tuning control signals, is started;
- a decision (84310) used to wait for a predefined period; and
- a process (84311) in which the 2-parameter extremum-seeking control algorithm is stopped.

For instance, a suitable 2-parameter extremum-seeking control algorithm may be a perturbation based extremum-seeking control algorithm, which comprises a step in which two different periodical perturbations are each applied to one of the tuning control signals. For instance, this approach is discussed in chapter 2 of said book of K. B. Ariyur and M. Krstic, in the case of a purely analog implementation. It offers higher performance than the one used in the fifteenth embodiment.

More generally, p being an integer greater than or equal to 2, in a different embodiment such that the single-input-port and single-output-port tuning unit hasp adjustable impedance devices of the tuning unit, such that the control unit delivers p tuning control signals, and such that the reactance of each of the adjustable impedance devices of the tuning unit is mainly determined by one and only one of the tuning control signals, it is possible that at least one subsequent value of each of the tuning control signals is generated using ap-parameter extremum-seeking control algorithm which is a perturbation based extremum-seeking control algorithm, which comprises a step in which p different periodical perturbations are each applied to one of the tuning control signals.

Eighteenth Embodiment

The eighteenth embodiment of a device of the invention, given by way of non-limiting example, also corresponds to the apparatus for radio communication shown in FIG. 3, to the flowcharts shown in FIG. 4 and in FIG. 6, and to the single-input-port and single-output-port tuning unit shown in FIG. 5. All explanations provided for the first embodiment and for the fourth embodiment are applicable to this eighteenth embodiment. Since p=2, the one or more adjustable impedance devices of the tuning unit may be referred to as "the adjustable impedance devices of the tuning unit".

In this eighteenth embodiment, the control unit delivers two tuning control signals to the single-input-port and single-output-port tuning unit, and the reactance of each of the adjustable impedance devices of the tuning unit is mainly determined by one and only one of the tuning control signals.

Figure 23:
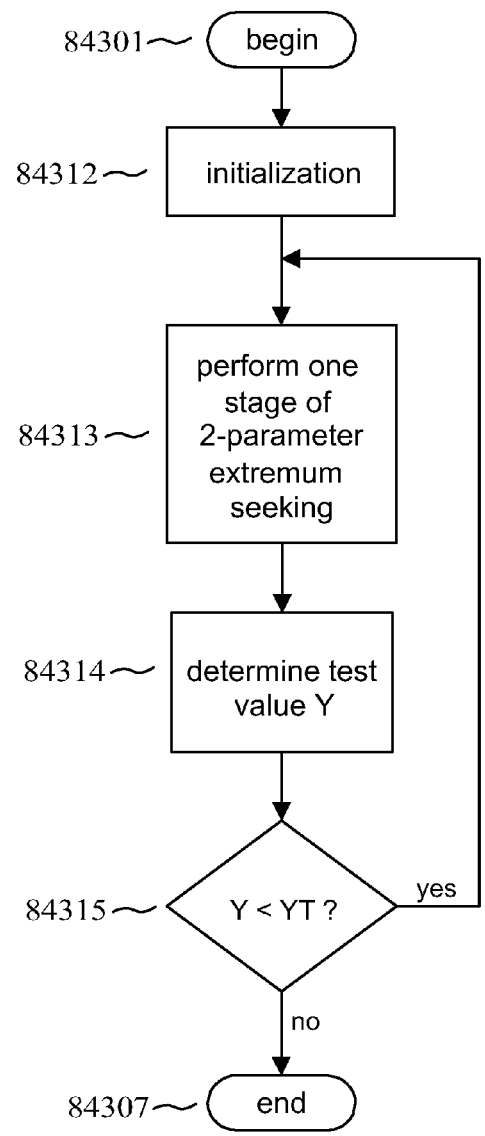
FIG. 23 shows a flowchart implemented in an apparatus for radio communication of the invention (eighteenth embodiment)

We have represented in FIG. 23 a flowchart applicable, in this eighteenth embodiment, to the process "generating subsequent values of the tuning control signals" (843) of FIG. 6. In addition to the begin symbol (84301) and the end symbol (84307), this flowchart comprises:

- a process (84312) in which a requirement is defined;
- a process (84313) in which one stage of a 2-parameter extremum-seeking control algorithm is performed, during which a predefined number of subsequent values of both tuning control signals are delivered;
- a process (84314) in which a test value is determined; and
- a decision (84315) used to reach the end symbol (84307) if the test value satisfies the requirement (which corresponds to a termination criterion).

For instance, a suitable 2-parameter extremum-seeking control algorithm may be a stochastic extremum-seeking control algorithm, which comprises a step in which two different stochastic or random perturbations are each applied to one of the tuning control signals. For instance, this approach is discussed in chapter 8 of said book of S.-J. Liu and M. Krstic, in the case of a purely analog implementation. It offers higher performance than the one used in the sixteenth embodiment.

More generally, p being an integer greater than or equal to 2, in a different embodiment such that the single-input-port and single-output-port tuning unit has p adjustable impedance devices of the tuning unit, such that the control unit delivers p tuning control signals, and such that the reactance of each of the adjustable impedance devices of the tuning unit is mainly determined by one and only one of the tuning control signals, it is possible that at least one subsequent value of each of the tuning control signals is generated using a p-parameter extremum-seeking control algorithm which is a stochastic extremum-seeking control algorithm, which comprises a step in which p different stochastic or random perturbations are each applied to one of the tuning control signals.

Nineteenth Embodiment

Figure 24:
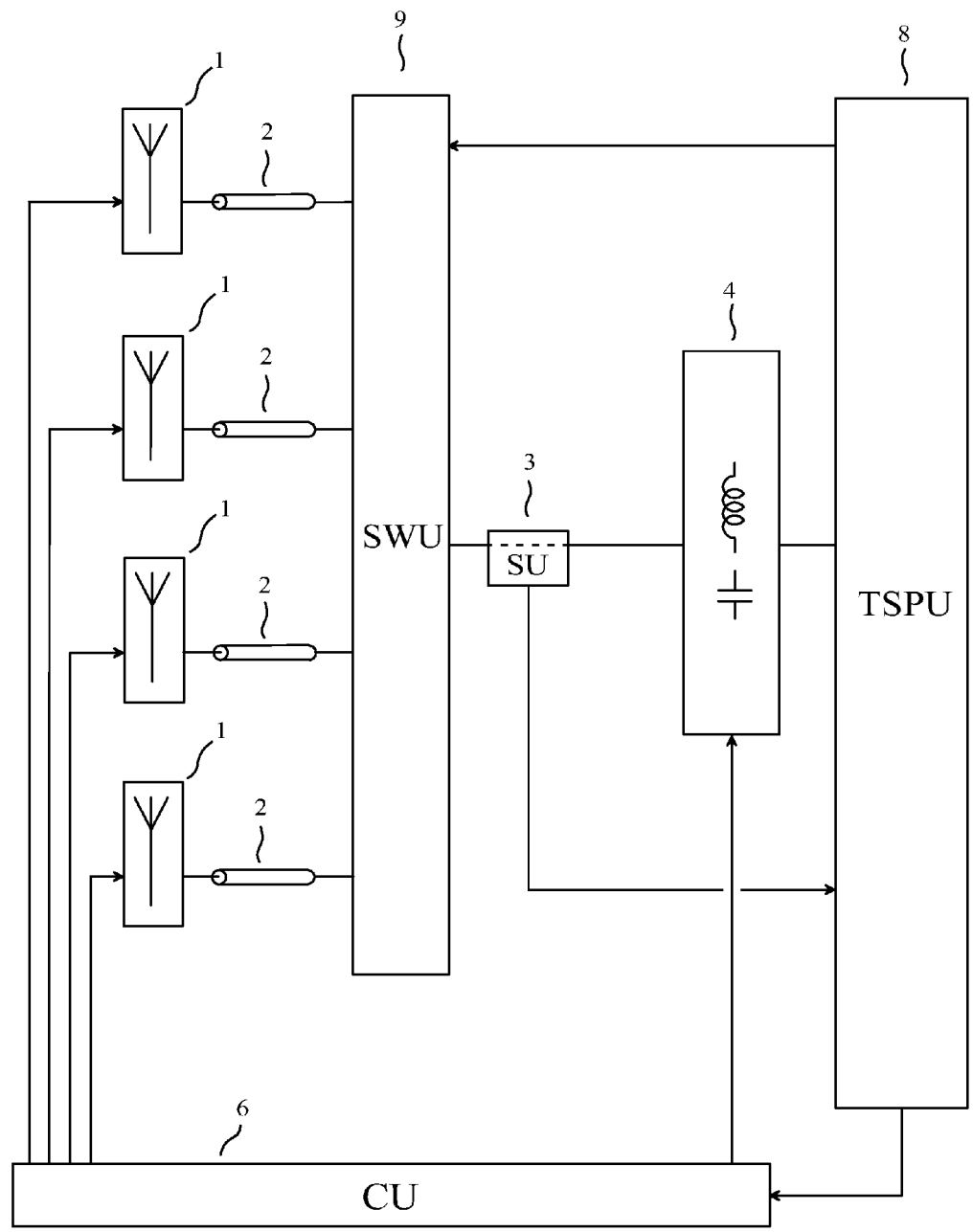
FIG. 24 shows the block diagram of an apparatus for radio communication of the invention (nineteenth embodiment)

As a nineteenth embodiment of a device of the invention, given by way of non-limiting example, we have represented in FIG. 24 the block diagram of an apparatus for radio communication comprising:

- N=4 tunable passive antennas (1), each of the tunable passive antennas comprising at least one antenna control device, said at least one antenna control device having at least one parameter having an effect on one or more characteristics of said each of the tunable passive antennas, said at least one parameter being adjustable by electrical means;
- a switching unit (9), the switching unit comprising N antenna ports each coupled to one and only one of the tunable passive antennas through a feeder (2), the switching unit comprising an antenna array port, the switching unit operating in an active configuration determined by one or more "configuration instructions", the active configuration being one of a plurality of allowed configurations, the switching unit providing, in any one of the allowed configurations, for signals in a given frequency band, a bidirectional path between the antenna array port and one and only one of the antenna ports;
- a single-input-port and single-output-port tuning unit (4) having an input port and an output port, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at a given frequency in the given frequency band, each of the one or more adjustable impedance devices of the tuning unit has a reactance, the reactance of any one of the one or more adjustable impedance devices of the tuning unit being adjustable by electrical means;
- a sensing unit (3) delivering one or more "sensing unit output signals", each of the one or more sensing unit output signals being mainly determined by one or more electrical variables sensed (or measured) at the output port while an excitation is applied to the input port, the output port being indirectly coupled to the antenna array port through the sensing unit;
- a transmission and signal processing unit (8), the transmission and signal processing unit delivering the one or more configuration instructions, the transmission and signal processing unit delivering one or more "antenna adjustment instructions", the transmission and signal processing unit applying the excitation to the input port, the transmission and signal processing unit estimating q real quantities depending on an impedance seen by the output port, where q is an integer greater than or equal to one, by utilizing one or more of the one or more sensing unit output signals, the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of one or more of the q real quantities depending on an impedance seen by the output port, at least one of the tuning unit adjustment instructions being a "subsequent tuning unit adjustment instruction", each of the one or more subsequent tuning unit adjustment instructions being determined by utilizing an extremum-seeking control algorithm, the extremum-seeking control algorithm seeking to maximize or to minimize a performance variable, the performance variable being estimated as a function of one or more of the one or more sensing unit output signals; and
- a control unit (6), the control unit delivering one or more "antenna control signals" to the tunable passive antennas, each of the one or more antenna control signals being determined as a function of at least one of the one or more antenna adjustment instructions, each said at least one parameter of each said at least one antenna control device of each of the tunable passive antennas being determined by at least one of the one or more antenna control signals, the control unit delivering one or more "tuning control signals" to the single-input-port and single-output-port tuning unit, each of the one or more tuning control signals being determined as a function of at least one of the tuning unit adjustment instructions, the reactance of each of the one or more adjustable impedance devices of the tuning unit being determined by at least one of the one or more tuning control signals.

The switching unit operates (or is used) in an active configuration determined by the one or more configuration instructions, the active configuration being one of a plurality of allowed configurations, the switching unit providing, in any one of the allowed configurations, for signals in the given frequency band, a path between the antenna array port and one of the antenna ports. Thus, the switching unit operates in an active configuration which is one of the allowed configurations, and each allowed configuration corresponds to a selection of an antenna port among the N antenna ports. It is also possible to say that the switching unit operates in an active configuration corresponding to a selection of an antenna port among the N antenna ports.

Each allowed configuration corresponds to a selection of an antenna port among the N antenna ports, the switching unit providing, for signals in the given frequency band, a path between the antenna array port and the selected antenna port. This path may preferably be a low loss path for signals in the given frequency band. The specialist understands that a suitable switching unit may comprise one or more electrically controlled switches and/or change-over switches. In this case, one or more of said one or more electrically controlled switches and/or change-over switches may for instance be an electro-mechanical relay, or a microelectromechanical switch, or a circuit using one or more PIN diodes and/or one or more insulated-gate field-effect transistors as switching devices.

In this nineteenth embodiment, it is not possible to say that, for each of the tunable passive antennas, a signal port of the tunable passive antenna is coupled, directly or indirectly, to the output port. However, in this nineteenth embodiment, the output port is, at a given time, coupled to one and only one of the N tunable passive antennas. Or, more precisely, the output port is, at any given time except during a change of active configuration, indirectly coupled to a signal port of one and only one of the N tunable passive antennas, through the sensing unit, the switching unit, and one and only one of the feeders.

The output port being indirectly coupled to the antenna array port through the sensing unit, the specialist sees that the apparatus for radio communication allows, at the given frequency, a transfer of power from the input port to an electromagnetic field radiated by the tunable passive antennas. Thus, the apparatus for radio communication is such that, if a power is received by the input port at the given frequency, a part of said power received by the input port is transferred to an electromagnetic field radiated by the tunable passive antennas at the given frequency, so that a power of the electromagnetic field radiated by the tunable passive antennas at the given frequency is equal to said part of said power received by the input port. The apparatus for radio communication also allows, at the given frequency, a transfer of power from an electromagnetic field incident on the tunable passive antennas to the input port. Additionally, the single-input-port and single-output-port tuning unit (4) and the tunable passive antennas (1) are such that, at said given frequency, for suitable values of the one or more tuning control signals and of the one or more antenna control signals, a low-loss transfer of power from the input port to an electromagnetic field radiated by the tunable passive antennas can be obtained (for radio emission), and a low-loss transfer of power from an electromagnetic field incident on the tunable passive antennas to the input port can be obtained (for radio reception).

The apparatus for radio communication is such that open-loop control is utilized to determine each of the one or more antenna adjustment instructions, and open-loop control is utilized to generate each of the one or more antenna control signals. The specialist understands that this characteristic for instance implies that the sensing unit output signals are not used to obtain the one or more antenna control signals.

The apparatus for radio communication is a radio transmitter or a radio transceiver, so that the transmission and signal processing unit (8) also performs functions which have not been mentioned above, and which are well known to specialists. The given frequency band only contains frequencies greater than or equal to 300 MHz.

For instance, each of the one or more configuration instructions may be determined as a function of:
one or more localization variables, defined as in the twelfth embodiment;
a frequency used for radio communication with the tunable passive antennas;
one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

The elements of said set of additional variables may further comprise one or more variables which are different from the localization variables and which characterize the grip with which a user is holding the apparatus for radio communication.

Each of the one or more configuration instructions may for instance be determined using a lookup table.

Each of the one or more configuration instructions may be of any type of digital message. Each of the one or more antenna adjustment instructions and each of the tuning unit adjustment instructions may be of any type of digital message. The one or more configuration instructions, the one or more antenna adjustment instructions and the tuning unit adjustment instructions are delivered during several adjustment sequences. The transmission and signal processing unit begins an adjustment sequence when one or more configuration instructions are delivered. The transmission and signal processing unit ends the adjustment sequence when the last tuning unit adjustment instruction of the adjustment sequence has been delivered. The duration of an adjustment sequence is less than 100 microseconds.

In order to respond to variations in the electromagnetic characteristics of the volume surrounding the tunable passive antennas and/or in the frequency of operation, adjustment sequences may take place repeatedly. For instance, a new adjustment sequence may start periodically, for instance every 10 milliseconds.

Outside the adjustment sequences, the transmission and signal processing unit uses the one or more sensing unit output signals to estimate one or more quantities each depending on a power delivered by the output port. For instance, such quantities each depending on a power delivered by the output port may be used to control the power delivered by the output port, by varying a power delivered to the input port.

Twentieth Embodiment

As a twentieth embodiment of the invention, given by way of non-limiting example, we consider a method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

delivering one or more "antenna control signals" as a function of a "selected frequency", each of the one or more tunable passive antennas comprising at least one antenna control device, said at least one antenna control device having at least one parameter having an effect on one or more characteristics of said each of the one or more tunable passive antennas, said at least one parameter being adjustable by electrical means, said at least one parameter being mainly determined by at least one of the one or more antenna control signals;

applying an excitation to the input port, the excitation having a carrier frequency referred to as "the carrier frequency of the excitation", the carrier frequency of the excitation being equal to the selected frequency;

sensing one or more electrical variables at the output port while the excitation is applied, to obtain one or more "sensing unit output signals", each of the one or more sensing unit output signals being mainly determined by at least one of the one or more electrical variables sensed at the output port;

measuring, at one or more locations in the single-input-port and single-output-port tuning unit, a temperature, to obtain one or more "temperature signals", each of the one or more temperature signals being mainly determined by one or more of the temperatures at said one or more locations;

estimating q real quantities depending on an impedance seen by the output port, where q is an integer greater than or equal to one, by utilizing one or more of the one or more sensing unit output signals;

delivering one or more "tuning control signals", the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals, the step of delivering one or more tuning control signals comprising the following steps:

generating, for each of the one or more tuning control signals, an initial value of said each of the one or more tuning control signals, as a function of one or more of said q real quantities depending on an impedance seen by the output port, and as a function of said one or more temperature signals; and generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

The specialist understands that, for each of the one or more tuning control signals, open-loop control is utilized to generate the initial value of said each of the one or more tuning control signals. The specialist also knows that the characteristics of the components of the single-input-port and single-output-port tuning unit depend on temperature. The specialist understands that, for this reason, it is advantageous to take into account said one or more temperature signals to generate the initial value of each of the one or more tuning control signals. The specialist understands how to generate an initial value of each of the one or more tuning control signals, as a function of one or more of said q real quantities depending on an impedance seen by the output port, and as a function of said one or more temperature signals. The specialist also knows that the characteristics of the components of the single-input-port and single-output-port tuning unit depend on the frequency and on temperature. Consequently, it is also advantageous to take into account the carrier frequency of the excitation to generate the initial value of each of the one or more tuning control signals. Thus, for each of the one or more tuning control signals, the initial value of said each of the one or more tuning control signals may also be a function of one or more quantities depending on the carrier frequency of the excitation. The specialist understands how to generate an initial value of each of the one or more tuning control signals, as a function of one or more of said q real quantities depending on an impedance seen by the output port, as a function of one or more quantities depending on the carrier frequency of the excitation, and as a function of said one or more temperature signals.

Figure 25:
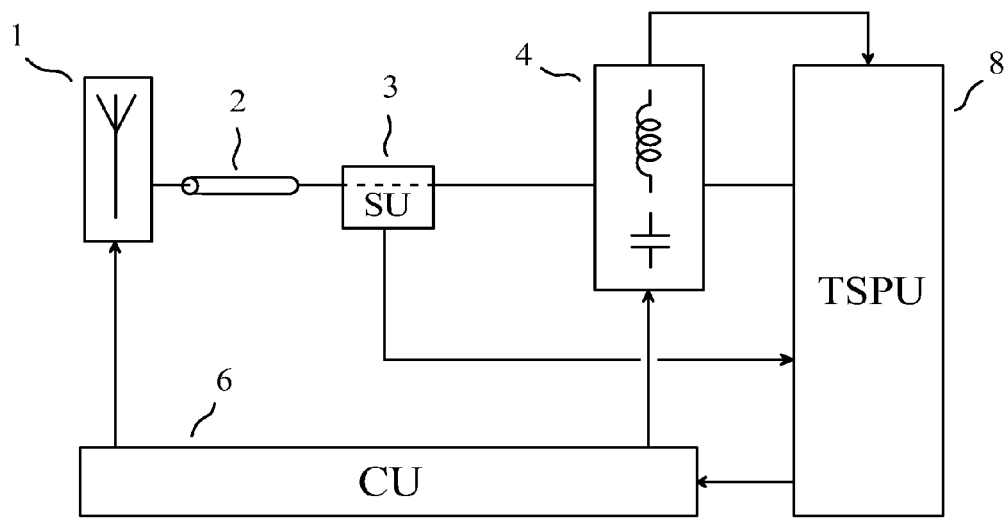
FIG. 25 shows a block diagram of an apparatus for radio communication of the invention (twentieth embodiment)

We have represented in FIG. 25 the block diagram of a first apparatus for radio communication implementing the method of this twentieth embodiment of the invention, the apparatus for radio communication comprising:

a tunable passive antenna (1) comprising at least one antenna control device, said at least one antenna control device having at least one parameter having an effect on one or more characteristics of the tunable passive antenna, said at least one parameter being adjustable by electrical means;

a feeder (2);

a single-input-port and single-output-port tuning unit (4) having an input port and an output port, the single-input-port and single-output-port tuning unit comprising p adjustable impedance devices, where p is an integer greater than or equal to 2, the p adjustable impedance devices being referred to as "the one or more adjustable impedance devices of the tuning unit" and being such that, at a given frequency, each of the one or more adjustable impedance devices of the tuning unit has a reactance, the reactance of any one of the one or more adjustable impedance devices of the tuning unit being adjustable by electrical means, the single-input-port and single-output-port tuning unit comprising a temperature measurement device which measures, at one or more locations in the single-input-port and single-output-port tuning unit, a temperature, to obtain one or more "temperature signals", each of the one or more temperature signals being mainly determined by one or more of the temperatures at said one or more locations;

a sensing unit (3) delivering one or more "sensing unit output signals", each of the one or more sensing unit output signals being mainly determined by one or more electrical variables sensed at the output port while an excitation is applied to the input port;

a transmission and signal processing unit (8), the transmission and signal processing unit delivering one or more "antenna adjustment instructions", the transmission and signal processing unit applying the excitation to the input port, the excitation having a carrier frequency referred to as "the carrier frequency of the excitation", the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of said one or more temperature signals and as a function of one or more of said q real quantities depending on an impedance seen by the output port, at least one of the tuning unit adjustment instructions being a "subsequent tuning unit adjustment instruction", the transmission and signal processing unit performing an extremum-seeking control algorithm to generate each of the one or more subsequent tuning unit adjustment instructions, the extremum-seeking control algorithm seeking to maximize or to minimize a performance variable, the performance variable being estimated as a function of one or more of the one or more sensing unit output signals; and a control unit (6) similar to the one used in the first embodiment, the control unit delivering one or more "antenna control signals" to the tunable passive antenna, the control unit delivering one or more "tuning control signals" to the single-input-port and single-output-port tuning unit.

Each of the one or more initial tuning unit adjustment instructions may also be a function of one or more quantities depending on the carrier frequency of the excitation, so that it may be determined as a function of one or more of said q real quantities depending on an impedance seen by the output port, as a function of one or more quantities depending on the carrier frequency of the excitation, and as a function of said one or more temperature signals.

Figure 26:
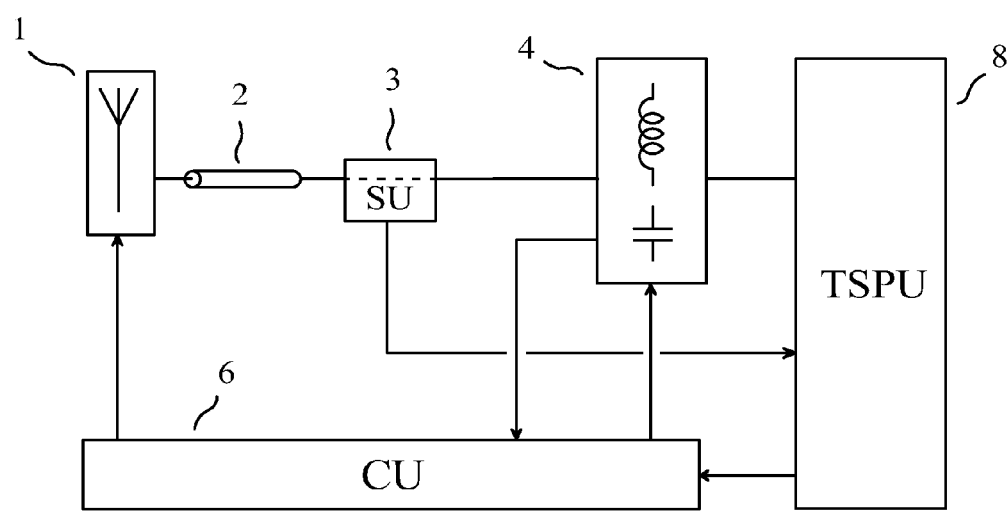
FIG. 26 shows a block diagram of an apparatus for radio communication of the invention (twentieth embodiment)

We have represented in FIG. 26 the block diagram of a second apparatus for radio communication implementing the method of this twentieth embodiment of the invention, the apparatus for radio communication comprising:

a tunable passive antenna (1) comprising at least one antenna control device, said at least one antenna control device having at least one parameter having an effect on one or more characteristics of the tunable passive antenna, said at least one parameter being adjustable by electrical means;

a feeder (2);

a single-input-port and single-output-port tuning unit (4) having an input port and an output port, the single-input-port and single-output-port tuning unit comprising p adjustable impedance devices, where p is an integer greater than or equal to 2, the p adjustable impedance devices being referred to as "the one or more adjustable impedance devices of the tuning unit" and being such that, at a given frequency, each of the one or more adjustable impedance devices of the tuning unit has a reactance, the reactance of any one of the one or more adjustable impedance devices of the tuning unit being adjustable by electrical means, the single-input-port and single-output-port tuning unit comprising a temperature measurement device which measures, at one or more locations in the single-input-port and single-output-port tuning unit, a temperature, to obtain one or more "temperature signals", each of the one or more temperature signals being determined by one or more of the temperatures at said one or more locations;

a sensing unit (3) delivering one or more "sensing unit output signals", each of the one or more sensing unit output signals being determined by one or more electrical variables sensed at the output port while an excitation is applied to the input port;

a transmission and signal processing unit (8) similar to the one used in the first embodiment, the transmission and signal processing unit delivering one or more "antenna adjustment instructions" and "tuning unit adjustment instructions", at least one of the tuning unit adjustment instructions being an "initial tuning unit adjustment instruction", at least one of the tuning unit adjustment instructions being a "subsequent tuning unit adjustment instruction"; and a control unit (6), the control unit receiving the one or more antenna adjustment instructions, the control unit delivering one or more "antenna control signals" to the tunable passive antenna, each of the one or more antenna control signals being determined as a function of at least one of the one or more antenna adjustment instructions, each of said parameters being mainly determined by at least one of the one or more antenna control signals, the control unit receiving the tuning unit adjustment instructions, the control unit delivering one or more "tuning control signals" to the single-input-port and single-output-port tuning unit, the control unit generating, for each of the one or more tuning control signals, one or more values of said each of the one or more tuning control signals, each of said one or more values of said each of the one or more tuning control signals being determined as a function of said one or more temperature signals and as a function of at least one of the tuning unit adjustment instructions, the reactance of each of the one or more adjustable impedance devices of the tuning unit being mainly determined by at least one of the one or more tuning control signals.

The specialist understands that, in this twentieth embodiment, the step of delivering one or more tuning control signals can be faster, for a given accuracy, than the corresponding step of the first embodiment, because the extremum-seeking control algorithm is started closer to the optimal values of the tuning control signals, thanks to the use of the one or more temperature signals.

Twenty-First Embodiment

The twenty-first embodiment of a device of the invention, given by way of non-limiting example, also corresponds to the apparatus for radio communication shown in FIG. 25 or to the apparatus for radio communication shown in FIG. 26, and all corresponding explanations provided for the twentieth embodiment are applicable to this twenty-first embodiment.

Figure 27:
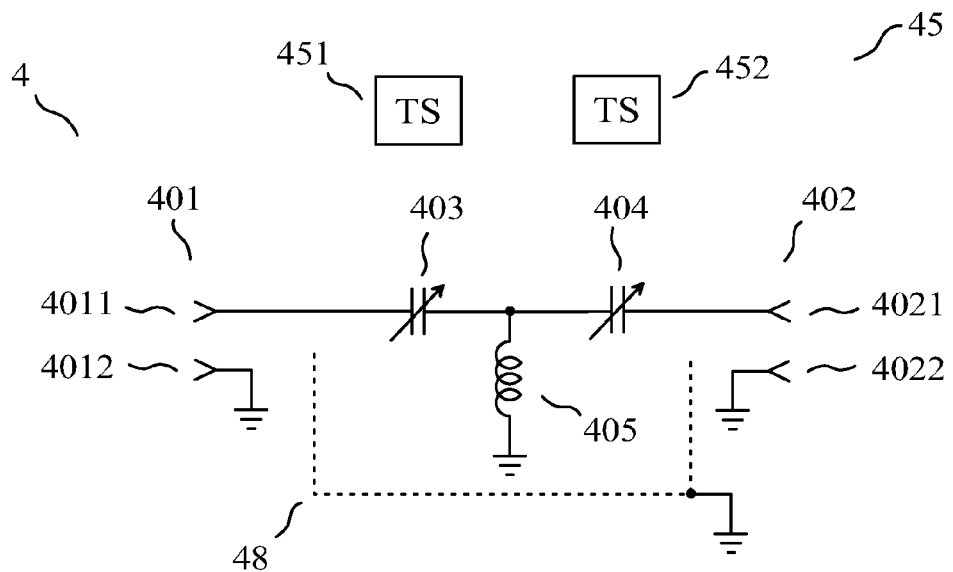
FIG. 27 shows a schematic diagram of a single-input-port and single-output-port tuning unit, which may be used in the apparatuses for radio communication shown in FIG. 25 and FIG. 26 (twenty-first embodiment)

We have represented in FIG. 27 the single-input-port and single-output-port tuning unit (4) used in this twenty-first embodiment. This single-input-port and single-output-port tuning unit comprises:

an output port (401) having two terminals (4011) (4012), the output port being single-ended;

an input port (402) having two terminals (4021) (4022), the input port being single-ended;

one of the one or more adjustable impedance devices of the tuning unit (403), presenting a negative reactance and having a terminal connected to a terminal of the output port;

one of the one or more adjustable impedance devices of the tuning unit (404), presenting a negative reactance and having a terminal connected to a terminal of the input port;

a winding (405), having a first terminal coupled to ground, and having a second terminal coupled to a terminal of each of the one or more adjustable impedance devices of the tuning unit (403) (404);

a temperature measurement device (45) comprising two temperature sensors (451) (452), the temperature measurement device measuring, at the location of each of the temperature sensors, a temperature, to obtain one or more temperature signals, each of the one or more temperature signals being mainly determined by the temperature at the location of one of the temperature sensors; and an electromagnetic screen (48), which is grounded.

All said adjustable impedance devices of the tuning unit (403) (404) are adjustable by electrical means, but the circuits and the control links needed to adjust the reactance of each of the one or more adjustable impedance devices of the tuning unit are not shown in FIG. 27. The links needed to power feed the temperature sensors (451) (452) and to carry said one or more temperature signals are not shown in FIG. 27.

Experimental results have shown that the electromagnetic characteristics of the volume surrounding the single-input-port and single-output-port tuning unit often influence $Z_U$. The specialist understands that this phenomenon may be detrimental to the apparatus for radio communication of the invention, because open-loop control is utilized to generate the initial values of the one or more tuning control signals. Experimental results have shown that this phenomenon may be mitigated by reducing the variable electromagnetic field produced by the single-input-port and single-output-port tuning unit outside the single-input-port and single-output-port tuning unit. In FIG. 27, an appropriate reduction of this electromagnetic field is provided by the electromagnetic screen (48), which may also be referred to as electromagnetic shield, and which is connected to a ground plane of the printed circuit board on which the single-input-port and single-output-port tuning unit is built.

A first one of the temperature sensors (451) is located near a first one of the one or more adjustable impedance devices of the tuning unit (403), in such a way that it measures a temperature which is close to the temperature of said first one of the one or more adjustable impedance devices of the tuning unit. A second one of the temperature sensors (452) is located near a second one of the one or more adjustable impedance devices of the tuning unit (404), in such a way that it measures a temperature which is close to the temperature of said second one of the one or more adjustable impedance devices of the tuning unit. In this manner, the one or more temperature signals provide information on the temperatures of each of the one or more adjustable impedance devices of the tuning unit, which may be different from one another. The specialist understands that these temperatures may in particular be different if a significant high-frequency power is applied to the input port, because the powers dissipated in the one or more adjustable impedance devices of the tuning unit are typically different from one another.

In this twenty-first embodiment, two temperature sensors are used, to measure, at two locations in the single-input-port and single-output-port tuning unit, a temperature. Thus, it is possible that the number of locations in the single-input-port and single-output-port tuning unit, at which a temperature is measured, is greater than or equal to 2.

Twenty-Second Embodiment

The twenty-second embodiment of a device of the invention, given by way of non-limiting example, also corresponds to the apparatus for radio communication shown in FIG. 25 or to the apparatus for radio communication shown in FIG. 26, and all corresponding explanations provided for the twentieth embodiment are applicable to this twenty-second embodiment.

Figure 28:
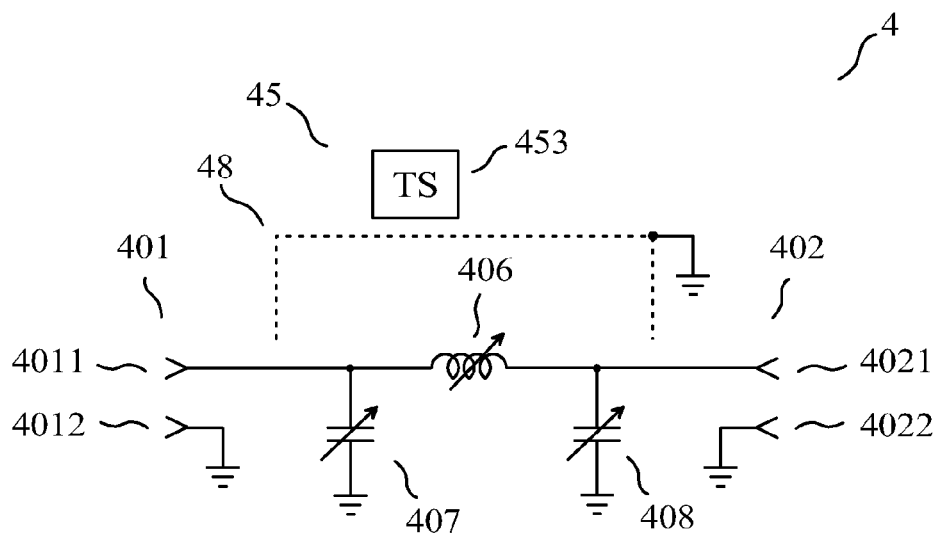
FIG. 28 shows a schematic diagram of a single-input-port and single-output-port tuning unit, which may be used in the apparatuses for radio communication shown in FIG. 25 and FIG. 26 (twenty-second embodiment)

We have represented in FIG. 28 the single-input-port and single-output-port tuning unit (4) used in this twenty-second embodiment. This single-input-port and single-output-port tuning unit comprises:

an output port (401) having two terminals (4011) (4012), the output port being single-ended;

an input port (402) having two terminals (4021) (4022), the input port being single-ended;

one of the one or more adjustable impedance devices of the tuning unit (406), presenting a positive reactance, having a first terminal connected to a terminal of the input port, and having a second terminal connected to a terminal of the output port;

one of the one or more adjustable impedance devices of the tuning unit (407), presenting a negative reactance and connected in parallel with the output port;

one of the one or more adjustable impedance devices of the tuning unit (408), presenting a negative reactance and connected in parallel with the input port;

a temperature measurement device (45) comprising a single temperature sensor (453), the temperature measurement device measuring, at the location of the temperature sensor, a temperature, to obtain one or more temperature signals, each of the one or more temperature signals being mainly determined by the temperature at the location of the temperature sensor; and an electromagnetic screen (48), which is grounded.

All said adjustable impedance devices of the tuning unit (406) (407) (408) are adjustable by electrical means, but the circuits and the control links needed to adjust the reactance of each of the one or more adjustable impedance devices of the tuning unit are not shown in FIG. 28. The links needed to power feed the temperature sensor (453) and to carry said one or more temperature signals are not shown in FIG. 28.

In this twenty-second embodiment, the electromagnetic screen (48) forms an enclosure containing all said adjustable impedance devices of the tuning unit (406) (407) (408), in which the temperature is almost uniform. This is why a single temperature sensor is used.

In this twenty-second embodiment, three adjustable impedance devices of the tuning unit are used. Thus, it is possible that the number of adjustable impedance devices of the tuning unit is greater than or equal to 3.

Twenty-Third Embodiment

The twenty-third embodiment of a device of the invention, given by way of non-limiting example, also corresponds to the apparatus for radio communication shown in FIG. 25 or to the apparatus for radio communication shown in FIG. 26, and all corresponding explanations provided for the twentieth embodiment are applicable to this twenty-third embodiment.

Figure 29:
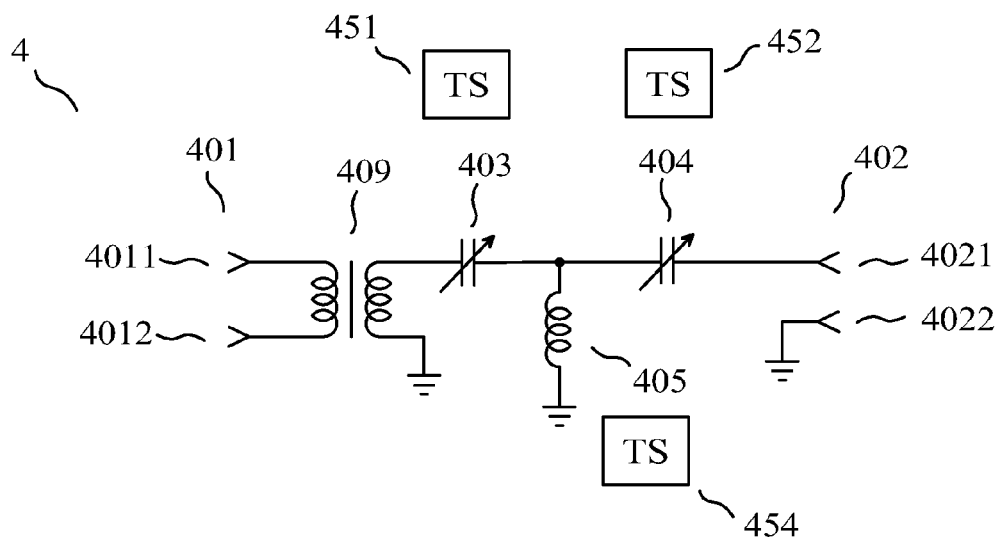
FIG. 29 shows a schematic diagram of a single-input-port and single-output-port tuning unit, which may be used in the apparatuses for radio communication shown in FIG. 25 and FIG. 26 (twenty-third embodiment)

We have represented in FIG. 29 the single-input-port and single-output-port tuning unit (4) used in this twenty-third embodiment. This single-input-port and single-output-port tuning unit comprises:
- an output port (401) having two terminals (4011) (4012), the output port being symmetrical (i.e., balanced);
- an input port (402) having two terminals (4021) (4022), the input port being single-ended;
- a transformer (409);
- two adjustable impedance devices of the tuning unit (403) (404), each presenting a negative reactance;
- a coil (405); and
- a temperature measurement device comprising three passive temperature sensors (451) (452) (454), the temperature measurement device measuring, at the location of each of the temperature sensors, a temperature, to obtain one or more temperature signals, each of the one or more temperature signals being mainly determined by the temperature at the location of one of the temperature sensors.

All said adjustable impedance devices of the tuning unit (403) (404) are adjustable by electrical means, but the circuits and the control links needed to adjust the reactance of each of the one or more adjustable impedance devices of the tuning unit are not shown in FIG. 29. The links needed to carry said one or more temperature signals are not shown in FIG. 29.

A first one of the temperature sensors (451) is located near a first one of the one or more adjustable impedance devices of the tuning unit (403), in such a way that it measures a temperature which is close to the temperature of said first one of the one or more adjustable impedance devices of the tuning unit. A second one of the temperature sensors (452) is located near a second one of the one or more adjustable impedance devices of the tuning unit (404), in such a way that it measures a temperature which is close to the temperature of said second one of the one or more adjustable impedance devices of the tuning unit. A third one of the temperature sensors (454) is located near the coil (405), in such a way that it measures a temperature which is close to the temperature of the coil. In this manner, the one or more temperature signals provide information on the temperatures of the coil and of each of the one or more adjustable impedance devices of the tuning unit, which may be different from one another. The specialist understands that these temperatures may in particular be different if a significant high-frequency power is applied to the input port and transferred from the input port to the output port. The coil used in this twenty-third embodiment comprises a ferrite core, so that its inductance and its losses depend on the coil's temperature. This is why the third one of the temperature sensors (454) is present.

In this twenty-third embodiment, the transformer (409) is used to obtain a symmetrical output port. Such a transformer is often referred to as a balun.

More generally, according to the invention, it is possible that the input port and/or the output port of the single-input-port and single-output-port tuning unit are single-ended, and it is possible that the input port and/or the output port of the single-input-port and single-output-port tuning unit are balanced or symmetrical.

In this twenty-third embodiment, three temperature sensors are used, to measure, at three locations in the single-input-port and single-output-port tuning unit, a temperature. Thus, it is possible that the number of locations in the single-input-port and single-output-port tuning unit, at which a temperature is measured, is greater than or equal to 3.

Twenty-Fourth Embodiment

Figure 30:
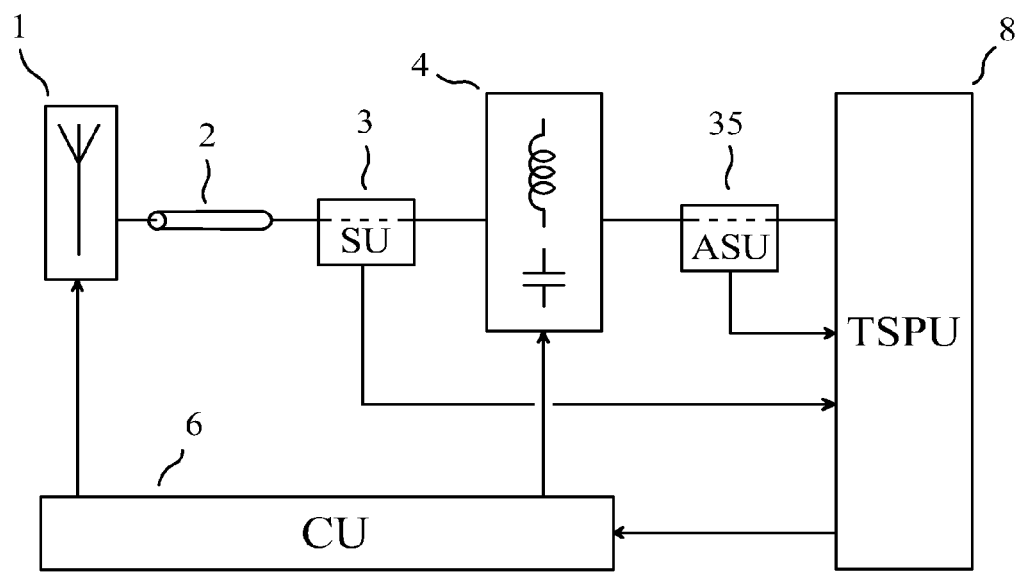
FIG. 30 shows a block diagram of an apparatus for radio communication of the invention (twenty-fourth embodiment).

As a twenty-fourth embodiment of a device of the invention, given by way of non-limiting example, we have represented in FIG. 30 the block diagram of an apparatus for radio communication comprising:
- a tunable passive antenna (1), the tunable passive antenna comprising at least one antenna control device, said at least one antenna control device having at least one parameter having an effect on one or more characteristics of the tunable passive antenna, said at least one parameter being adjustable by electrical means;
- a feeder (2);
- a single-input-port and single-output-port tuning unit (4), similar to the one used in the first embodiment, having an input port and an output port;
- a sensing unit (3), the sensing unit delivering one or more "sensing unit output signals", each of the one or more sensing unit output signals being mainly determined by one or more electrical variables sensed at the output port while an excitation is applied to the input port;
- an additional sensing unit (35), the additional sensing unit delivering one or more "additional sensing unit output signals", each of the one or more additional sensing unit output signals being mainly determined by one or more electrical variables sensed at the input port while said excitation is applied to the input port;
- a transmission and signal processing unit (8), the transmission and signal processing unit delivering one or more "antenna adjustment instructions", the transmission and signal processing unit applying the excitation to the input port through the additional sensing unit, the excitation having a carrier frequency referred to as "the carrier frequency of the excitation", the transmission and signal processing unit estimating q real quantities depending on an impedance seen by the output port, where q is an integer greater than or equal to one, by utilizing one or more of the one or more sensing unit output signals, the transmission and signal processing unit delivering "tuning unit adjustment instructions", at least one of the tuning unit adjustment instructions being an "initial tuning unit adjustment instruction", each of the one or more initial tuning unit adjustment instructions being determined as a function of one or more of the q real quantities depending on an impedance seen by the output port, at least one of the tuning unit adjustment instructions being a "subsequent tuning unit adjustment instruction", the transmission and signal processing unit performing an extremum-seeking control algorithm to generate each of the one or more subsequent tuning unit adjustment instructions, the extremum-seeking control algorithm seeking to minimize a performance variable, the performance variable being estimated as a function of one or more of the one or more sensing unit output signals and as a function of one or more of the one or more additional sensing unit output signals; and
- a control unit (6) similar to the one described in the nineteenth embodiment.

The sensing unit (3) may for instance be such that the one or more sensing unit output signals comprise: a first sensing unit output signal proportional to a first electrical variable, the first electrical variable being a voltage across the output port; and a second sensing unit output signal proportional to a second electrical variable, the second electrical variable being a current flowing out of the output port. Alternatively, the sensing unit (3) may for instance be such that the one or more sensing unit output signals comprise: a first sensing unit output signal proportional to a first electrical variable, the first electrical variable being an incident voltage at the output port; and a second sensing unit output signal proportional to a second electrical variable, the second electrical variable being a reflected voltage at the output port.

The additional sensing unit (35) may for instance be such that the one or more additional sensing unit output signals comprise: a first additional sensing unit output signal proportional to a first electrical variable, the first electrical variable being a voltage across the input port; and a second additional sensing unit output signal proportional to a second electrical variable, the second electrical variable being a current flowing in the input port. Alternatively, the additional sensing unit (35) may for instance be such that the one or more additional sensing unit output signals comprise: a first additional sensing unit output signal proportional to a first electrical variable, the first electrical variable being an incident voltage at the input port; and a second additional sensing unit output signal proportional to a second electrical variable, the second electrical variable being a reflected voltage at the input port.

The specialist knows that said incident voltage at the input port, denoted by $U_F$, is given by $$u_F = (v_U + Z_{RU} i_U)/2 \qquad (6)$$

where $v_U$ is a complex voltage across the input port, $i_U$ is a complex current flowing in the input port, and $Z_{RU}$ is a reference impedance used to define the incident voltage at the input port.

For instance, the performance variable may be substantially a product of three terms, this product being the product of a negative constant, an average of the square of an instantaneous voltage at the output port, and the inverse of an average of the square of an instantaneous incident voltage at the input port. It is possible to show that, if the reference impedance used to define the incident voltage at the input port is equal to the internal impedance of a port of the transmission and signal processing unit, this port delivering the excitation to the input port through the additional sensing unit, then minimizing this performance variable maximizes a transducer power gain of the single-input-port and single-output-port tuning unit. This performance variable is such that variations of the absolute value of the complex envelope of the excitation have no effect on the performance variable. Thus, an amplitude modulation of the excitation alone does not cause variations, as a function of time, of this performance variable, so that this performance variable is suitable for the case where the excitation is amplitude modulated.

INDICATIONS ON INDUSTRIAL APPLICATIONS

The method of the invention is suitable for optimally, automatically and quickly adjusting one or more tunable passive antennas and a single-input-port and single-output-port tuning unit. The apparatus for radio communication of the invention can optimally, automatically and quickly adjust its one or more tunable passive antennas and its single-input-port and single-output-port tuning unit.

The apparatus for radio communication of the invention may for instance be a radio receiver, a radio transmitter, or a radio transceiver. The invention is particularly suitable for mobile radio transmitters and mobile radio transceivers, for instance those used in portable radiotelephones or portable computers, which may be subject to fast variations in the electromagnetic characteristics of the medium surrounding the one or more tunable passive antennas being used for radio communication.

The invention claimed is:

1. A method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

delivering one or more antenna control signals, each of the one or more tunable passive antennas comprising at least one antenna control device, said at least one antenna control device having at least one parameter having an effect on one or more characteristics of said each of the one or more tunable passive antennas, said at least one parameter being adjustable by electrical means, said at least one parameter being mainly determined by at least one of the one or more antenna control signals;

applying an excitation to the input port;

sensing one or more electrical variables at the output port while the excitation is applied, to obtain one or more sensing unit output signals, each of the one or more sensing unit output signals being mainly determined by at least one of the one or more electrical variables sensed at the output port;

estimating q real quantities depending on an impedance seen by the output port, where q is an integer greater than or equal to one, by utilizing one or more of the one or more sensing unit output signals; and delivering one or more tuning control signals, the single-input-port and single-output-port tuning unit comprising p adjustable impedance devices, where p is an integer greater than or equal to one, the p adjustable impedance devices being referred to as the one or more adjustable impedance devices of the tuning unit and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals, the step of delivering one or more tuning control signals comprising the following steps:

generating, for each of the one or more tuning control signals, an initial value of said each of the one or more tuning control signals, as a function of one or more of the q real quantities depending on an impedance seen by the output port; and generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

2. The method of claim 1, wherein, at a given time, the output port is coupled to one and only one of the one or more tunable passive antennas.

3. The method of claim 1, wherein the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port.

4. The method of claim 1, wherein p is greater than or equal to two, and wherein q is greater than or equal to two.

5. The method of claim 1, wherein the performance variable is substantially proportional to an image, under a function, of an absolute value of a complex envelope of an electrical variable sensed at the output port.

6. The method of claim 5, wherein the excitation is produced from a modulating signal, the performance variable being such that, if an absolute value of the modulating signal is not substantially zero, then the performance variable is substantially inversely proportional to an image of the absolute value of the modulating signal under the function.

7. The method of claim 1, wherein the excitation has a carrier frequency referred to as the carrier frequency of the excitation, and wherein, for each of the one or more tuning control signals, the initial value of said each of the one or more tuning control signals is also a function of one or more quantities depending on the carrier frequency of the excitation.

8. The method of claim 7, wherein the one or more antenna control signals are determined as a function of a selected frequency, and wherein the carrier frequency of the excitation is equal to the selected frequency.

9. The method of claim 1, wherein the one or more antenna control signals are delivered as a function of one or more of said q real quantities depending on an impedance seen by the output port.

10. An apparatus for radio communication comprising:
one or more tunable passive antennas, each of the one or more tunable passive antennas comprising at least one antenna control device, said at least one antenna control device having at least one parameter having an effect on one or more characteristics of said each of the one or more tunable passive antennas, said at least one parameter being adjustable by electrical means;
a single-input-port and single-output-port tuning unit having an input port and an output port, the apparatus for radio communication allowing, at a given frequency, a transfer of power from the input port to an electromagnetic field radiated by the one or more tunable passive antennas, the single-input-port and single-output-port tuning unit comprising p adjustable impedance devices, where p is an integer greater than or equal to one, the p adjustable impedance devices being referred to as the one or more adjustable impedance devices of the tuning unit and being such that, at the given frequency, each of the one or more adjustable impedance devices of the tuning unit has a reactance, the reactance of any one of the one or more adjustable impedance devices of the tuning unit being adjustable by electrical means;
a sensing unit delivering one or more sensing unit output signals, each of the one or more sensing unit output signals being mainly determined by one or more electrical variables sensed at the output port while an excitation is applied to the input port;
a transmission and signal processing unit, the transmission and signal processing unit delivering one or more antenna adjustment instructions, the transmission and signal processing unit applying the excitation to the input port, the transmission and signal processing unit estimating q real quantities depending on an impedance seen by the output port, where q is an integer greater than or equal to one, by utilizing one or more of the one or more sensing unit output signals, the transmission and signal processing unit delivering tuning unit adjustment instructions, at least one of the tuning unit adjustment instructions being an initial tuning unit adjustment instruction, each of the one or more initial tuning unit adjustment instructions being determined as a function of one or more of the q real quantities depending on an impedance seen by the output port, at least one of the tuning unit adjustment instructions being a subsequent tuning unit adjustment instruction, the transmission and signal processing unit performing an extremum-seeking control algorithm to generate each of the one or more subsequent tuning unit adjustment instructions, the extremum-seeking control algorithm seeking to maximize or to minimize a performance variable, the performance variable being estimated as a function of one or more of the one or more sensing unit output signals; and
a control unit, the control unit delivering one or more antenna control signals to the one or more tunable passive antennas, each of the one or more antenna control signals being determined as a function of at least one of the one or more antenna adjustment instructions, each said at least one parameter of each said at least one antenna control device of each of the one or more tunable passive antennas being mainly determined by at least one of the one or more antenna control signals, the control unit delivering one or more tuning control signals to the single-input-port and single-output-port tuning unit, each of the one or more tuning control signals being determined as a function of at least one of the tuning unit adjustment instructions, the reactance of each of the one or more adjustable impedance devices of the tuning unit being mainly determined by at least one of the one or more tuning control signals.

11. The apparatus for radio communication of claim 10, wherein, at a given time, the output port is coupled to one and only one of the one or more tunable passive antennas.

12. The apparatus for radio communication of claim 10, wherein the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port.

13. The apparatus for radio communication of claim 10, wherein p is greater than or equal to two, and wherein q is greater than or equal to two.

14. The apparatus for radio communication of claim 10, wherein the one or more sensing unit output signals comprise: a first sensing unit output signal proportional to a first electrical variable, the first electrical variable being a voltage across the output port; and a second sensing unit output signal proportional to a second electrical variable, the second electrical variable being a current flowing out of the output port.

15. The apparatus for radio communication of claim 10, wherein the one or more sensing unit output signals comprise: a first sensing unit output signal proportional to a first electrical variable, the first electrical variable being an incident voltage at the output port; and a second sensing unit output signal proportional to a second electrical variable, the second electrical variable being a reflected voltage at the output port.

16. The apparatus for radio communication of claim 10, wherein the performance variable is substantially proportional to an image, under a function, of an absolute value of a complex envelope of an electrical variable sensed at the output port.

17. The apparatus for radio communication of claim 16, wherein the excitation is produced from a modulating signal, the performance variable being such that, if an absolute value of the modulating signal is not substantially zero, then the performance variable is substantially inversely proportional to an image of the absolute value of the modulating signal under the function.

18. The apparatus for radio communication of claim 10, wherein the excitation has a carrier frequency referred to as the carrier frequency of the excitation, and wherein each of the one or more initial tuning unit adjustment instructions is also a function of one or more quantities depending on the carrier frequency of the excitation.

19. The apparatus for radio communication of claim 18, wherein the one or more antenna adjustment instructions are determined as a function of a selected frequency, and wherein the carrier frequency of the excitation is equal to the selected frequency.

20. The apparatus for radio communication of claim 10, wherein the one or more antenna adjustment instructions are determined as a function of one or more of said q real quantities depending on an impedance seen by the output port.

\* \* \* \* \*